US012513953B2

United States Patent
Hsu et al.

(10) Patent No.: US 12,513,953 B2
(45) Date of Patent: Dec. 30, 2025

(54) TUNING THRESHOLD VOLTAGE IN NANOSHEET TRANSITOR DEVICES

(71) Applicant: Taiwan Semiconductor Manufacturing Company, Ltd., Hsin-Chu (TW)

(72) Inventors: Chung-Wei Hsu, Baoshan Township (TW); Hou-Yu Chen, Zhubei (TW); Chih-Hao Wang, Baoshan Township (TW); Ching-Wei Tsai, Hsinchu (TW); Kuo-Cheng Chiang, Zhubei (TW); Kuan-Lun Cheng, Hsin-Chu (TW); Mao-Lin Huang, Hsinchu (TW); Jia-Ni Yu, New Taipei (TW); Lung-Kun Chu, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 240 days.

(21) Appl. No.: 17/868,831

(22) Filed: Jul. 20, 2022

(65) Prior Publication Data
US 2022/0352314 A1 Nov. 3, 2022

Related U.S. Application Data

(62) Division of application No. 16/819,632, filed on Mar. 16, 2020, now Pat. No. 11,502,168.
(Continued)

(51) Int. Cl.
*H01L 29/06* (2006.01)
*H01L 21/28* (2025.01)
(Continued)

(52) U.S. Cl.
CPC ..... *H10D 62/121* (2025.01); *H01L 21/28088* (2013.01); *H01L 21/28556* (2013.01);
(Continued)

(58) Field of Classification Search
CPC ......... H01L 29/66439; H01L 29/78696; H01L 29/775; H01L 29/0665;
(Continued)

(56) References Cited

U.S. PATENT DOCUMENTS 9,997,519 B1 6/2018 Bao et al.
2017/0200738 A1* 7/2017 Kim ..................... H10D 86/011
(Continued)

OTHER PUBLICATIONS

Erben et al. "Work Function Setting in High-k Metal Gate Devices." Published Nov. 5, 2018.
(Continued)

*Primary Examiner* — Julio J Maldonado
*Assistant Examiner* — Stanetta D Isaac
(74) *Attorney, Agent, or Firm* — Eschweiler & Potashnik, LLC

(57) ABSTRACT

In some embodiments, the present disclosure relates to an integrated chip that includes a first nanosheet field effect transistor (NSFET). The first NSFET includes a first nanosheet channel structure arranged over a substrate, a second nanosheet channel structure arranged directly over the first nanosheet channel structure, and a first gate electrode structure. The first and second nanosheet channel structures extend in parallel between first and second source/drain regions. The first gate electrode structure includes a first conductive ring and a second conductive ring that completely surround outer sidewalls of the first nanosheet channel structure and the second nanosheet channel structure, respectively, and that comprise a first material. The first gate electrode structure also includes a passivation layer that
(Continued)

completely surrounds the first and second conductive rings, is arranged directly between the first and second nanosheet channel structures, and comprises a second material different than the first material.

20 Claims, 20 Drawing Sheets

Related U.S. Application Data

(60) Provisional application No. 62/927,866, filed on Oct. 30, 2019.

(51) Int. Cl.

| | |
|---|---|
| *H01L 21/285* | (2006.01) |
| *H01L 21/311* | (2006.01) |
| *H01L 21/8234* | (2006.01) |
| *H01L 27/088* | (2006.01) |
| *H01L 29/08* | (2006.01) |
| *H01L 29/10* | (2006.01) |
| *H01L 29/423* | (2006.01) |
| *H01L 29/49* | (2006.01) |
| *H10D 30/67* | (2025.01) |
| *H10D 62/10* | (2025.01) |
| *H10D 62/13* | (2025.01) |
| *H10D 62/17* | (2025.01) |
| *H10D 64/66* | (2025.01) |
| *H10D 84/01* | (2025.01) |
| *H10D 84/03* | (2025.01) |
| *H10D 84/83* | (2025.01) |

(52) U.S. Cl.
CPC .... *H01L 21/31111* (2013.01); *H10D 30/6735* (2025.01); *H10D 62/151* (2025.01); *H10D 62/292* (2025.01); *H10D 64/667* (2025.01); *H10D 84/0128* (2025.01); *H10D 84/013* (2025.01); *H10D 84/014* (2025.01); *H10D 84/0144* (2025.01); *H10D 84/0158* (2025.01); *H10D 84/038* (2025.01); *H10D 84/834* (2025.01)

(58) Field of Classification Search
CPC .............................. H01L 29/0669–068; H01L 29/7853–2029/7858; H01L 29/78687; H01L 27/092; H01L 21/28088; H01L 21/28556; H01L 21/31111; B82Y 10/00; H10D 62/121; H10D 62/151; H10D 62/292; H10D 84/0128; H10D 84/013; H10D 84/014; H10D 84/0144; H10D 84/0158; H10D 84/038; H10D 84/834; H10D 84/0177; H10D 84/83; H10D 84/85; H10D 30/6735; H10D 30/014; H10D 30/43; H10D 30/6757; H10D 64/667; H10D 64/017
See application file for complete search history.

(56) References Cited

U.S. PATENT DOCUMENTS

| | | |
|---|---|---|
| 2019/0088798 A1 | 3/2019 | Kim et al. |
| 2019/0131189 A1* | 5/2019 | Doornbos .............. B82Y 10/00 |
| 2019/0172828 A1 | 6/2019 | Smith et al. |
| 2022/0085014 A1* | 3/2022 | Zhang .............. H01L 29/78618 |

OTHER PUBLICATIONS

Wikipedia.org "Atomic Layer Deposition." Published on Mar. 14, 2020.
Non-Final Office Action dated Oct. 1, 2021 for U.S. Appl. No. 16/819,632.
Final Office Action dated Apr. 14, 2022 for U.S. Appl. No. 16/819,632.
Notice of Allowance dated Jul. 1, 2022 for U.S. Appl. No. 16/819,632.

* cited by examiner

400 ⤴

500 ⤴

TUNING THRESHOLD VOLTAGE IN NANOSHEET TRANSITOR DEVICES

REFERENCE TO RELATED APPLICATIONS

This application is a Divisional of U.S. application Ser. No. 16/819,632, filed on Mar. 16, 2020, which claims the benefit of U.S. Provisional Application No. 62/927,866, filed on Oct. 30, 2019. The contents of the above-referenced patent applications are hereby incorporated by reference in their entirety.

BACKGROUND

The semiconductor industry continues to improve the integration density of various electronic devices (e.g., transistors, diodes, resistors, capacitors, etc.) by, for example, reducing minimum feature sizes and/or arranging electronic devices closer to one another, which allows more components to be integrated into a given area. For example, a nanosheet field effect transistor (NSFET) comprising vertically arranged nanosheet channel structures, wherein multiple gates surround each nanosheet channel structure to reduce device area and to increase device control.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
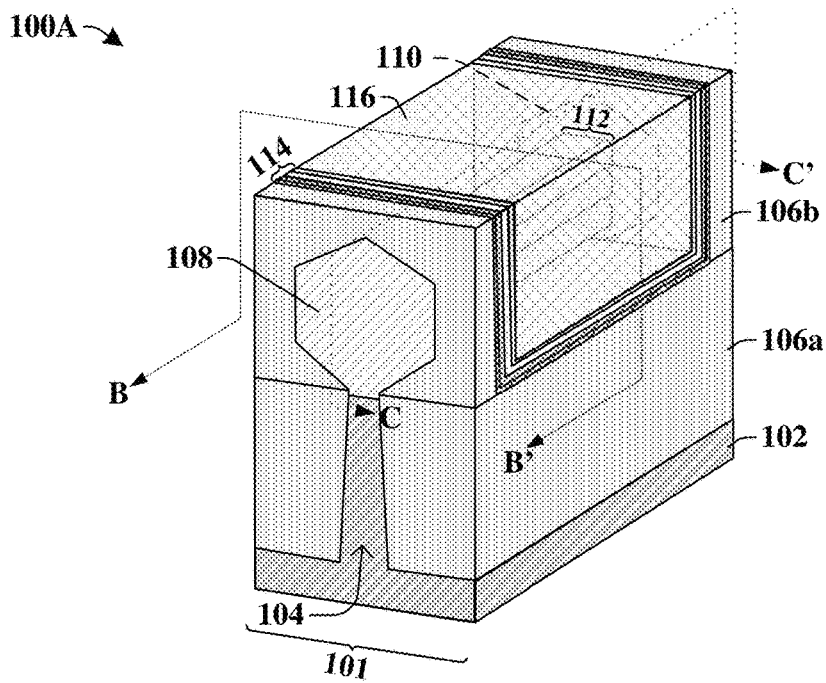
FIGS. 1A-C illustrate various views of some embodiments of a first nanosheet field effect transistor (NSFET) having a first gate electrode structure that includes a passivation layer comprising silicon and arranged over a first conductive layer comprising titanium nitride.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a nanosheet field-effect transistor (NSFET) may comprise nanosheet channel structures that extend in parallel from a first source/drain region to a second source/drain region. The nanosheet channel structures may be continuously surrounded by one or more gate electrode layers that form a gate electrode structure. Thus, the nanosheet channel structures may be turned "ON" to allow mobile charge carriers to travel from the first source/drain region to the second source/drain region by applying a voltage bias across the gate electrode structure that exceeds a threshold voltage of the NSFET.

The threshold voltage of the NSFET depends at least on the work function of the gate electrode structure, which can be controlled at least by thicknesses and compositions of the gate electrode layers of the gate electrode structure. For example, the gate electrode structure of an n-NSFET, wherein electrons are mobile charge carriers, may include a first gate electrode layer comprising aluminum that continuously surrounds the nanosheet channel structures. The work function of the gate electrode structure comprising aluminum is closer to the conduction band level of the first and second channel structures than the valence band level of the nanosheet channel structures which reduces the threshold voltage to turn "ON" the n-NSFET.

However, due to a precursor reaction for forming and/or composition of the first gate electrode layer, portions of the first gate electrode material that are arranged directly between the nanosheet channel structures may comprise a concentration of aluminum that is about 10 percent or greater than a concentration of aluminum in portions of the first gate electrode layer that are arranged on outer surfaces of the nanosheet channel structures. Also, the aluminum in the first gate electrode layer may diffuse into other layers of the gate electrode structure causing more unpredictability and/or variation in the concentration of aluminum. In such embodiments, the work function of the gate electrode structure and thus, the threshold voltage of the NSFET may vary because the gate electrode structure does not have a uniform composition, thereby degrading performance of the NSFET.

Various embodiments of the present disclosure are directed towards a method of forming a first NSFET having a first gate electrode structure with a substantially uniform composition, and thus, substantially uniform first work function. The first gate electrode structure may comprise a first conductive layer comprising titanium nitride instead of aluminum, and the first conductive layer may be formed by a first atomic deposition layer (ALD) process to control the thickness and composition of the titanium nitride of the first conductive layer. In such embodiments, variation in the concentration of titanium throughout the first conductive layer may be less than 1 percent, and variation in the concentration of nitrogen throughout the first conductive layer may be less than 1 percent. Further, in some embodiments, a second ALD process may be performed to form a passivation layer that comprises silicon and does not comprise aluminum, is arranged over the first conductive layer, and is arranged between the nanosheet channel structures to push the first work function of the first gate electrode structure closer to the conduction band level than the valence band level of the nanosheet channel structures. As a result, in such embodiments, the first NSFET may be a reliable n-NSFET having a substantially uniform first threshold voltage.

Further, various embodiments of the present disclosure are also directed towards a method of forming a second NSFET (e.g., p-NSFET) laterally beside the first NSFET (e.g., n-NSFET). In some embodiments, the second NSFET may comprise a second gate electrode structure that is different (e.g., composition of layers, thickness of layers, number of layers, etc.) than the first gate electrode structure such that the second gate electrode structure has a second work function that is different than the first work function. In such embodiments, a dummy masking structure may be formed directly between nanosheet channel structures of the second NSFET, and then, the first conductive layer and passivation layer may be formed over nanosheet channel structures of the first and second NSFET. The dummy masking structure reduces the maximum dimension of the first conductive layer and the passivation layer for removal arranged directly between the nanosheet channel structures of the second NSFET to prevent inadvertent over-etching of the first gate electrode structure when selectively removing the first conductive layer and passivation layer from the nanosheet channel structures of the second NSFET. Thus, because of the dummy masking structure, the second NSFET may be formed laterally beside the first NSFET to increase device density without sacrificing the reliability of the first gate electrode structure.

FIG. 1A illustrates a perspective view 100A of some embodiments of a first nanosheet field effect transistor (NSFET) having a first gate electrode structure with a passivation layer comprising silicon over a first conductive layer comprising titanium nitride.

The perspective view 100A illustrates a first NSFET 101 that includes a substrate 102 comprising a first fin structure 104. The first fin structure 104 protrudes from the substrate 102 through a lower isolation structure 106a. A first source/drain region 108 is arranged on a first side of the first fin structure 104, and a second source/drain region 110 is arranged on a second side of the first fin structure 104. A first gate electrode structure 112 is arranged directly over the first fin structure 104, and nanosheet channel structures (see, 118a-c of FIG. 1B) are embedded within the first gate electrode structure 112. The nanosheet channel structures (see, 118a-c of FIG. 1B) extend from the first source/drain region 108 to the second source/drain region 110. In some embodiments, the first source/drain region 108 and the second source/drain region 110 are covered by an upper isolation structure 106b. The second source/drain region 110 is illustrated with a hashed line because in some embodiments, the second source/drain region 110 is not visible from the perspective view 100A of FIG. 1A. In some embodiments, a glue layer 116 may surround the first gate electrode structure 112. It will be appreciated that the glue layer 116 is illustrated as somewhat transparent such that the first gate electrode structure 112 may be visible in FIG. 1A, and thus, in some embodiments, the glue layer 116 is not transparent or is not somewhat transparent.

In some embodiments, the first source/drain region 108 and the second source/drain region 110 have a first doping type (e.g., n-type), and the substrate 102, the first fin structure 104, and the nanosheet channel structures (see, 118a-c of FIG. 1B) are an intrinsic semiconductor material. Thus, the first NSFET 101 may be an n-NSFET because when a voltage that is greater than a first threshold voltage is applied to the first gate electrode structure 112, electrons are the mobile charge carriers that flow from the first source/drain region 108 to the second source/drain region 110 through the nanosheet channel structures (see, 118a-c of FIG. 1B) surrounded by the first gate electrode structure 112. The first threshold voltage of the first NSFET 101 may depend on a first work function of the first gate electrode structure 112. The first gate electrode structure 112 may comprise multiple first gate electrode layers 114 which may influence the first work function of the first gate electrode structure 112 as described in more detail in FIG. 1B.

Further, it will be appreciated that in some instances, the first NSFET 101 may be also known as, for example, a gate-all-around FET, a gate surrounding transistor, a multi-bridge channel (MBC) transistor, a nanowire FET, or the like.

Figure 1B:
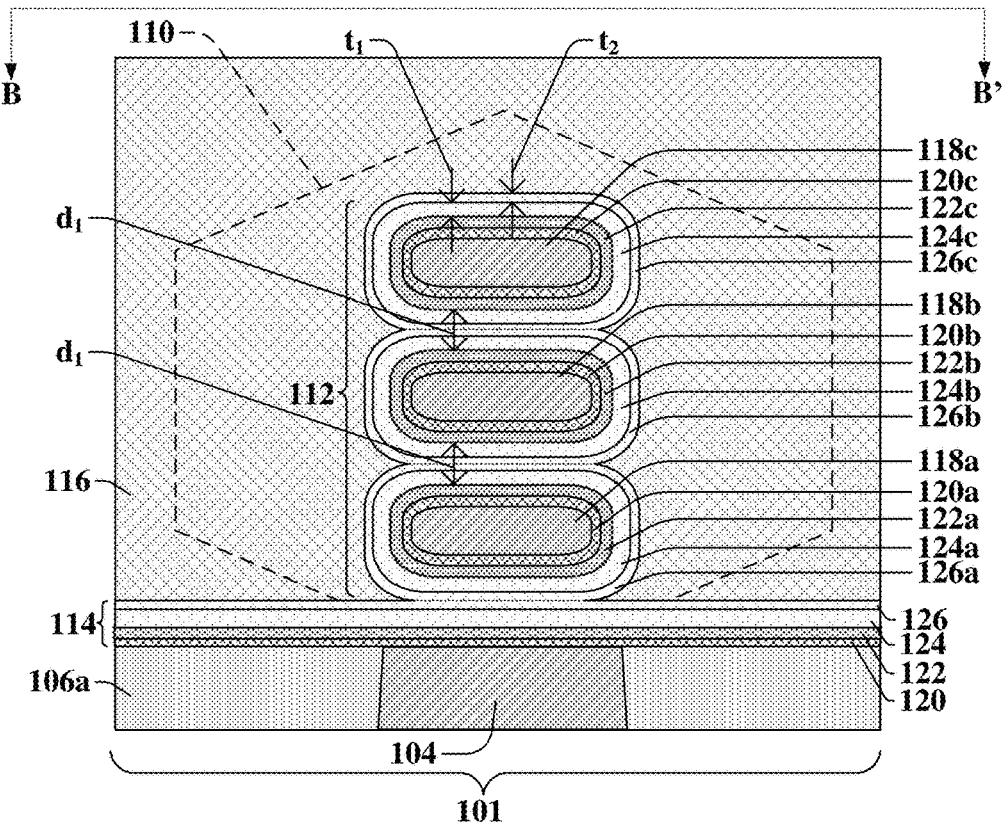

FIG. 1B illustrates a cross-sectional view 100B of some embodiments of the first NSFET 101 that may correspond to cross-section line BB' of FIG. 1A.

As illustrated in FIG. 1B, in some embodiments, the first NSFET 101 comprises a first nanosheet channel structure 118a arranged directly over the first fin structure 104, a second nanosheet channel structure 118b arranged directly over the first nanosheet channel structure 118a, and a third nanosheet channel structure 118c arranged directly over the second nanosheet channel structure 118b. Further, in some embodiments, the first fin structure 104 and the first through third nanosheet channel structures 118a-c comprise a same semiconductor material. For example, in some embodiments, the first fin structure 104 and the first through third nanosheet channel structures 118a-c may comprise intrinsic silicon. Further, the first fin structure 104 and the first through third nanosheet channel structures 118a-c are spaced apart from one another by the first gate electrode structure 112.

In some embodiments, the first gate electrode structure 112 comprises multiple first gate electrode layers 114 which may include the following: an interfacial layer 120, a gate dielectric layer 122, a first conductive layer 124, and a passivation layer 126. In some embodiments, the multiple first gate electrode layers 114 are arranged over the lower isolation structure 106a and also continuously surround the first through third nanosheet channel structures 118a-c. For example, in some embodiments, the interfacial layer 120 may comprise a first interfacial ring 120a, a second interfacial ring 120b, and a third interfacial ring 120c that directly contact and continuously surround the first nanosheet channel structure 118a, the second nanosheet channel structure 118b, and the third nanosheet channel structure 118c. In some embodiments, the interfacial layer 120 is also arranged over the lower isolation structure 106a and the first fin structure 104. In some embodiments, the gate dielectric layer 122 may comprise a first dielectric ring 122a, a second dielectric ring 122b, and a third dielectric ring 122c that are arranged over and continuously surround the first interfacial ring 120a, the second interfacial ring 120b, and the third interfacial ring 120c, respectively. In some embodiments, the first conductive layer 124 may comprise a first conductive ring 124a, a second conductive ring 124b, and a third conductive ring 124c that are arranged over and continuously surround the first dielectric ring 122a, the second dielectric ring 122b, and the third dielectric ring 122c, respectively. In some embodiments, the passivation layer 126 may comprise a first passivation ring 126a, a second passivation ring 126b, and a third passivation ring 126c that are arranged over and continuously surround the first conductive ring 124a, the second conductive ring 124b, and the third conductive ring 124c, respectively.

In some embodiments, the second passivation ring 126b directly contacts the first passivation ring 126a and the third passivation ring 126c. Further, in some embodiments, the second conductive ring 124b is completely separated from the first conductive ring 124a and the third conductive ring 124c by the passivation layer 126. Thus, the passivation layer 126 is arranged directly between the first fin structure 104 and the first nanosheet channel structure 118a, directly between the first nanosheet channel structure 118a and the second nanosheet channel structure 118b, and directly between the second nanosheet channel structure 118b and the third nanosheet channel structure 118c.

In some embodiments, the first work function of the first gate electrode structure 112 depends at least on materials and thicknesses of the first conductive layer 124 and of the passivation layer 126. In some embodiments, the first conductive layer 124 comprises titanium nitride and has a first thickness $t_1$ that is in a range of between, for example, approximately 8 angstroms and approximately 50 angstroms. The first thickness $t_1$ of the first conductive layer 124 may be substantially constant throughout portions of the first conductive layer 124, in some embodiments. In such embodiments, the first conductive layer 124 may have a minimum concentration of titanium and a maximum concentration of titanium. The difference between the maximum concentration of titanium and the minimum concentration of titanium may be less than or equal to about 1 percent. Similarly, in such embodiments, the first conductive layer 124 may have a minimum concentration of nitrogen and a maximum concentration of nitrogen. The difference between the maximum concentration of nitrogen and the minimum concentration of nitrogen may be less than or equal to about 1 percent. Thus, the first conductive layer 124 may be formed to have a composition (e.g., titanium nitride) and a first thickness $t_1$ that have a substantially low variation throughout the first conductive layer 124, thereby reducing variation in the first work function of the first gate electrode structure 112. For example, in some embodiments, the first conductive layer 124 may be formed by an atomic layer deposition (ALD) process.

Further, in some embodiments, the passivation layer 126 comprises silicon and has a second thickness $t_2$ in a range of between approximately 10 angstroms and approximately 20 angstroms, for example. In some embodiments, the silicon in the passivation layer 126 reduces the first work function of the first gate electrode structure 112. The work function of the first gate electrode structure 112 may be increased or decreased depending on the first thickness $t_1$ of the first conductive layer 124 and the second thickness $t_2$ of the passivation layer, thereby increasing or decreasing the first threshold voltage of the first NSFET 101.

In some embodiments, the first thickness $t_1$ and the second thickness $t_2$ are constrained by a first distance $d_1$ that separates the second dielectric ring 122b from the first dielectric ring 122a and that separates the second dielectric ring 122b from the third dielectric ring 122c. In some embodiments the first distance $d_1$ may be in a range of between, for example, approximately 4 nanometers and approximately 6 nanometers. In some embodiments, the first distance $d_1$ may be increased by increasing the spacing between the first through third nanosheet channel structures 118a-c. However, increasing the spacing between the first through third nanosheet channel structures 118a-c would increase the size of the first NSFET 101, which is undesirable as electronic devices continue to decrease.

Thus, processing methods used to form the first conductive layer 124 and the passivation layer 126 accommodate the following relationship between the first distance $d_1$ and the first and second thicknesses $t_1$, $t_2$: $d_1=t_2+2t_1$. For example, in some embodiments, $d_1$ may be equal to 5 nanometers. In such embodiments, the first thickness $t_1$ of the first conductive layer 124 may be equal to about 2 nanometers, and the second thickness $t_2$ of the passivation layer 126 may be equal to about 1 nanometer. In other embodiments, the relationship between the first distance $d_1$ and the first and second thicknesses $t_1$, $t_2$ may be as follows: $d_1=2t_2+2t_1$. If the first thickness $t_1$ is too large and such that the passivation layer 126 cannot be formed directly between the second nano sheet channel structure 118b and the first or third nanosheet channel structure 118a, 118c, the work function of the first gate electrode structure 112 would vary and thus, the first threshold voltage of the first NSFET 101 would also vary and be unpredictable. Therefore, in some embodiments, the first conductive layer 124 and the passivation layer 126 may be deposited through atomic layer deposition (ALD) processes for control of the first and second thickness $t_1$, $t_2$. In some embodiments, to prevent oxidation on the first conductive layer 124 and thus, to maximize the second thickness $t_2$, the first conductive layer 124 is performed in-situ with the passivation layer 126. In such embodiments, in-situ means that the substrate (102 of FIG. 1A) is not removed from a mainframe structure during formation of the first conductive layer 124 and the passivation layer 126 such that a vacuum seal is not broken between formation of the first conductive layer 124 and formation of the passivation layer 126.

Figure 1C:
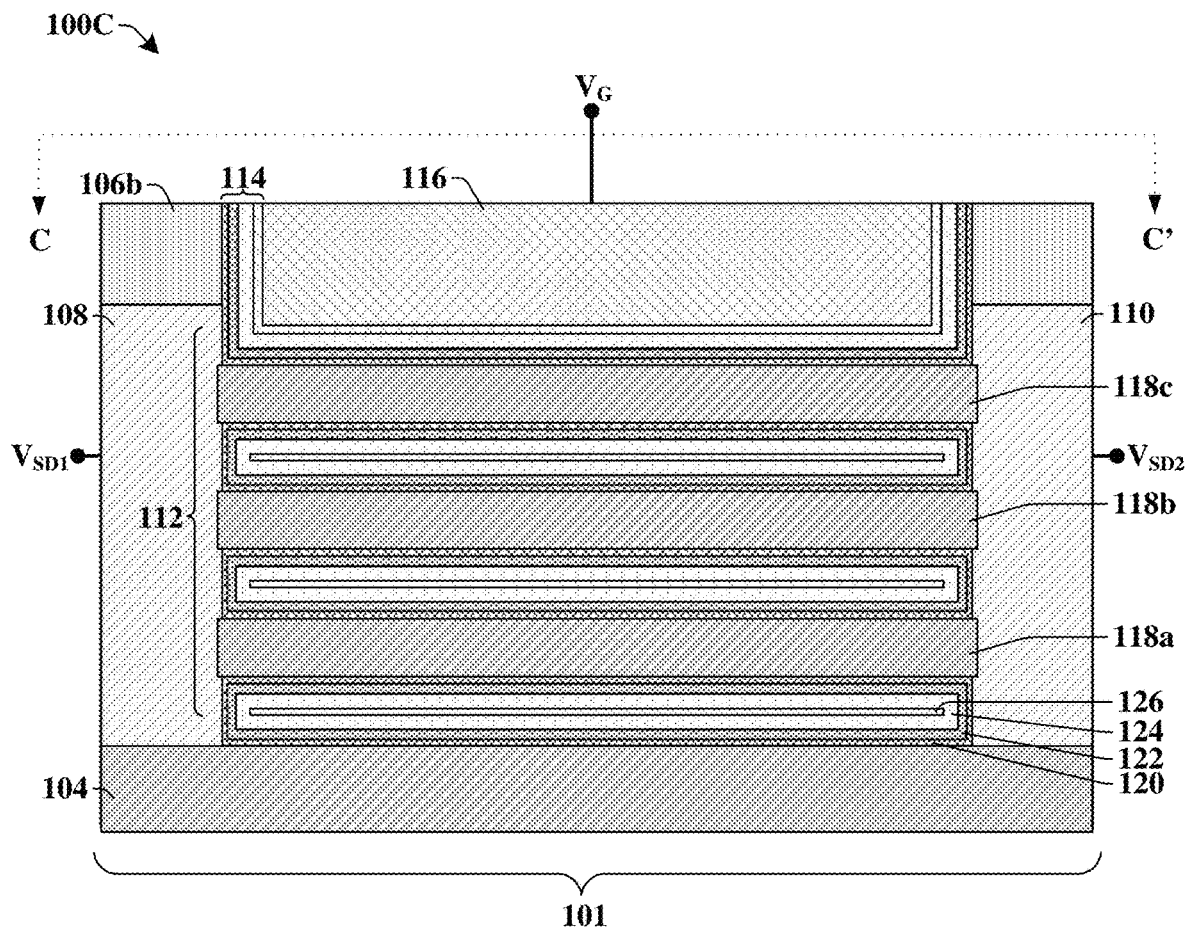

FIG. 1C illustrates a cross-sectional view 100C of some embodiments of the first NSFET 101 that may correspond to cross-section line CC' of FIG. 1A.

As illustrated in FIG. 1C, in some embodiments, the first, second, and third nanosheet channel structures 118a, 118b, 118c extend in parallel from the first source/drain region 108 to the second source/drain region 110. Further, the first, second, and third nanosheet channel structures 118a, 118b, 118c directly contact the first source/drain region 108 and the second source/drain region 110. In some embodiments, during the formation of the multiple first gate electrode layers 114, the multiple first gate electrode layers 114 are formed on the first fin structure 104, the first through third nanosheet channel structures 118a-c, the first source/drain region 108, and the second source/drain region 110. Thus, in some embodiments, from the cross-sectional view 100C, some of the multiple first gate electrode layers 114, such as the interfacial layer 120, the gate dielectric layer 122, and the first conductive layer 124 exhibit rectangular ring-like shapes. In other embodiments, the multiple first gate electrode layers 114 may exhibit more oval-like or circular ring-like shapes from the cross-sectional view 100C of FIG. 1C.

During operation of the first NSFET 101, a gate voltage $V_G$ may be applied to the glue layer 116, a first source/drain voltage $V_{SD1}$ may be applied to the first source/drain region 108, and a second source/drain voltage $V_{SD2}$ may be applied to the second source/drain region 110. In some embodiments, when an absolute value of the gate voltage $V_G$ exceeds an absolute value of the first threshold voltage of the first NSFET 101, the first NSFET 101 is turned "ON" such that mobile charge carriers (e.g., electrons) between the first source/drain region 108 and the second source/drain region 110. In some embodiments, contact vias couple the glue layer 116, the first source/drain region 108, and the second source/drain region 110 to a gate voltage source, a first source/drain voltage source, and a second source/drain voltage source, respectively. In some embodiments, the glue layer 116 comprises a conductive material, such as, for example, titanium nitride, tantalum nitride, or the like. Thus, the glue layer 116 may be electrically coupled to the first gate electrode structure 112. Because of the substantially constant compositions and thicknesses of the multiple first gate electrode layers 114 of the first gate electrode structure 112, the first threshold voltage of the first NSFET 101 may also be substantially constant. Therefore, when the gate voltage $V_G$ exceeds the first threshold voltage of the first NSFET 101, the first through third nanosheet channel structures 118a-c may be simultaneously and reliably turned "ON."

Figure 1D:
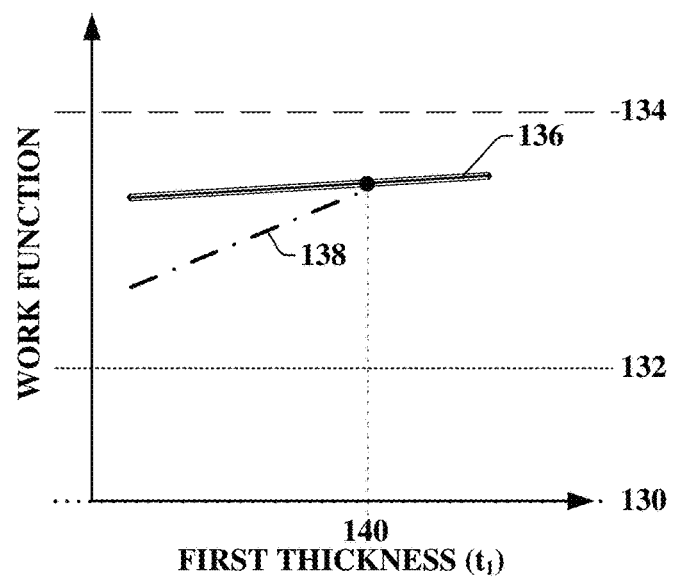
FIG. 1D illustrates a plot of some embodiments of a work function of a first gate electrode structure comprising a first conductive layer versus thickness of the first conductive layer that comprises titanium nitride.

FIG. 1D illustrates a plot 100D of work function versus the first thickness ($t_1$ of FIG. 1B) of the first conductive layer (124 of FIG. 1B) comprising titanium nitride.

As illustrated in FIG. 1D, a first plot line 136 illustrates the first work function of the first gate electrode structure (112 of FIG. 1B) versus the first thickness ($t_1$ of FIG. 1B) of the first conductive layer (124 of FIG. 1B) in some embodiments where the second thickness ($t_2$ of FIG. 1B) of the passivation layer (126 of FIG. 1B) equals zero. In other words, the first plot line 136 illustrates the first work function of the first gate electrode structure (112 of FIG. 1B) when the first gate electrode structure (112 of FIG. 1B) includes the first conductive layer (124 of FIG. 1B) comprising titanium nitride but does not include the passivation layer (126 of FIG. 1B). Thus, as the first thickness ($t_1$ of FIG. 1B) of the first conductive layer (124 of FIG. 1B) increases, the first work function of the first gate electrode structure (112 of FIG. 1B) comprising titanium nitride but not silicon increases. A second plot line 138 illustrates how the first work function of the first gate electrode structure (112 of FIG. 1B) changes in some embodiments when the first gate electrode structure (112 of FIG. 1B) includes the first conductive layer (124 of FIG. 1B) comprising titanium nitride and the passivation layer (126 of FIG. 1B) comprising silicon. The first gate electrode structure (112 of FIG. 1B) represented by the second plot line 138 may have a second thickness ($t_2$ of FIG. 1B) of the passivation layer (126 of FIG. 1B) that is greater than zero and is constant, while the first thickness ($t_1$ of FIG. 1B) is increased to collect work function data for the second plot line 138. The plot 100D shows that in some embodiments, because the second plot line 138 has a larger slope than the first plot line 136, the presence of the passivation layer (126 of FIG. 1B) comprising silicon increases the ability to vary the first work function of the first gate electrode structure (112 of FIG. 1B).

Further, the plot 100D of FIG. 1D illustrates a first thickness saturation value 140 defined by where the second plot line 138 intersects the first plot line 136. Before the first thickness saturation value 140 of the first conductive layer (124 of FIG. 1B), the silicon of the passivation layer (126 of FIG. 1B) decreases the first work function of the first gate electrode structure (112 of FIG. 1B). However, after the first thickness saturation value 140 of the first conductive layer (124 of FIG. 1B), the presence of the silicon of the passivation layer (126 of FIG. 1B) may not influence the first work function of the first gate electrode structure (112 of FIG. 1B). In some embodiments, the second plot line 138 may represent the first work function data as the first thickness ($t_1$ of FIG. 1B) is increased from about 8 angstroms to about 50 angstroms. Thus, in some embodiments, the first thickness saturation value 140 may be in a range of about 45 angstroms and about 55 angstroms, for example.

Further, a vacuum level 130, a conduction band level 132, and a valence band level 134 of the first through third nanosheet channel structures (118a-c of FIG. 1B) are illustrated on the plot 100D. Thus, when the first thickness ($t_1$ of FIG. 1B) of the first conductive layer (124 of FIG. 1B) comprising titanium nitride is low and when the first gate electrode structure (112 of FIG. 1B) comprises the passivation layer (126 of FIG. 1B), the first gate electrode structure (112 of FIG. 1B) has a first work function that is closest to the conduction band level 132 of the first through third nanosheet channel structures (118a-c of FIG. 1B). A first work function that is close to the conduction band level 132 reduces the first threshold voltage of the first NSFET (101 of FIG. 1B) when the first NSFET (101 of FIG. 1B) is an n-type NSFET. In other embodiments, a higher threshold voltage of the first NSFET (101 of FIG. 1B) may be desired, and thus, the first thickness ($t_1$ of FIG. 1B) of the first conductive layer (124 of FIG. 1B) may be increased. Thus, in some embodiments, the first thickness ($t_1$ of FIG. 1B) of the first conductive layer (124 of FIG. 1B) comprising titanium nitride may be adjusted to tune the first work function of the first gate electrode structure (112 of FIG. 1B), and thus, to tune the first threshold voltage of the first NSFET (101 of FIG. 1B).

Figure 2A:
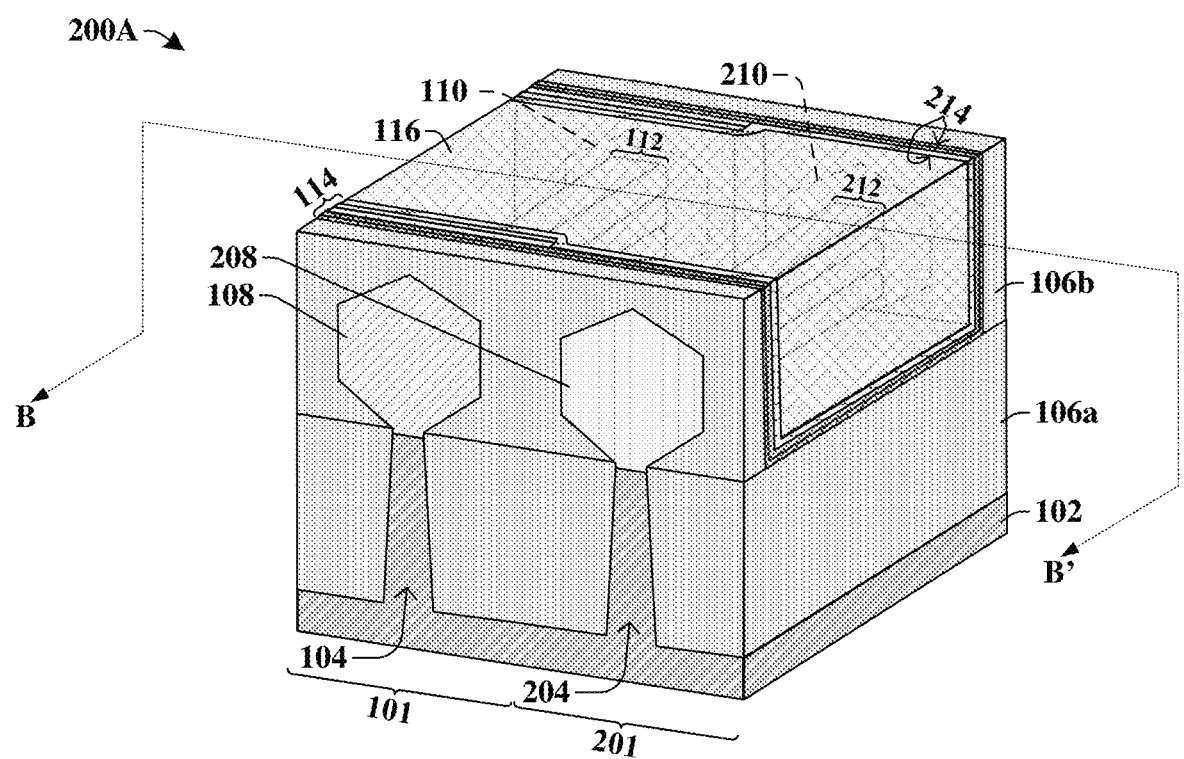
FIGS. 2A and 2B illustrate various views of some embodiments of a first NSFET having a first gate electrode structure arranged laterally beside a second NSFET having a second gate electrode structure different than the first gate electrode structure.

FIG. 2A illustrates a perspective view 200A of some embodiments of a first NSFET arranged laterally beside a second NSFET wherein a first gate electrode structure of the first NSFET has a different work function than a second gate electrode structure of the second NSFET.

The perspective view 200A illustrates a second NSFET 201 arranged laterally beside the first NSFET 101. In some embodiments, the second NSFET 201 may comprise a second fin structure 204 protruding from the substrate 102. In some embodiments, the second fin structure 204 comprises an intrinsic semiconductor material, protrudes from the substrate 102 and through the lower isolation structure 106a, and is spaced apart from the first fin structure 104 by the lower isolation structure 106a. In some embodiments, the second NSFET 201 comprises a third source/drain region 208 arranged on a first side of the second fin structure 204 and a fourth source/drain region 210 arranged on a second side of the second fin structure 204. A second gate electrode structure 212 is arranged directly over the second fin structure 204, and nanosheet channel structures (see, 218a-c of FIG. 2B) of the second NSFET 201 are embedded within the second gate electrode structure 212. The nanosheet channel structures (see, 218a-c) of the second NSFET 201 extend from the third source/drain region 208 to the fourth source/drain region 210. In some embodiments, the third source/drain region 208 and the fourth source/drain region 210 are covered by the upper isolation structure 106b.

Further, the glue layer 116 may surround the first and second gate electrode structures 112, 212.

In such embodiments, the first gate electrode structure 112 may have the first work function that influences the first threshold voltage of the first NSFET 101, and the second gate electrode structure 212 may have a second work function that influences a second threshold voltage of the second NSFET 201. The first work function may be different from the second work function, and thus, in some embodiments, the first gate electrode structure 112 may have a different structure (e.g., composition of layers, thickness of layers, number of layers, etc.) than the second gate electrode structure 212. In some embodiments, for example, the third source/drain region 208 and the fourth source/drain region 210 have a second doping type (e.g., p-type), whereas the first source/drain region 108 and the second source/drain region 110 has the first doping type (e.g., n-type) that is different than the second doping type (e.g., p-type). In such embodiments, the mobile charge carriers of the first NSFET 101 may be electrons when the first NSFET 101 is turned "ON," whereas the mobile charge carriers of the second NSFET 201 may be holes when the second NSFET 201 is turned "ON." In such embodiments, the first NSFET 101 may be an n-type NSFET, and the second NSFET 201 may be a p-type NSFET. In other embodiments, the first and second source/drain regions 108, 110 and the third and fourth source/drain regions 208, 210 may have a same doping type, and the first NSFET 101 and the second NSFET 201 have different threshold voltages due to the different structures and thus, different work functions of the first and second gate electrode structures 112, 212. In some embodiments, the first gate electrode structure 112 may comprise the multiple first gate electrode layers 114, and the second gate electrode structure 212 may comprise multiple second gate electrode layers 214. The multiple first gate electrode layers 114 and the multiple second gate electrode layers 214 may have similarities and differences, as described in more detail in FIG. 2B.

Figure 2B:
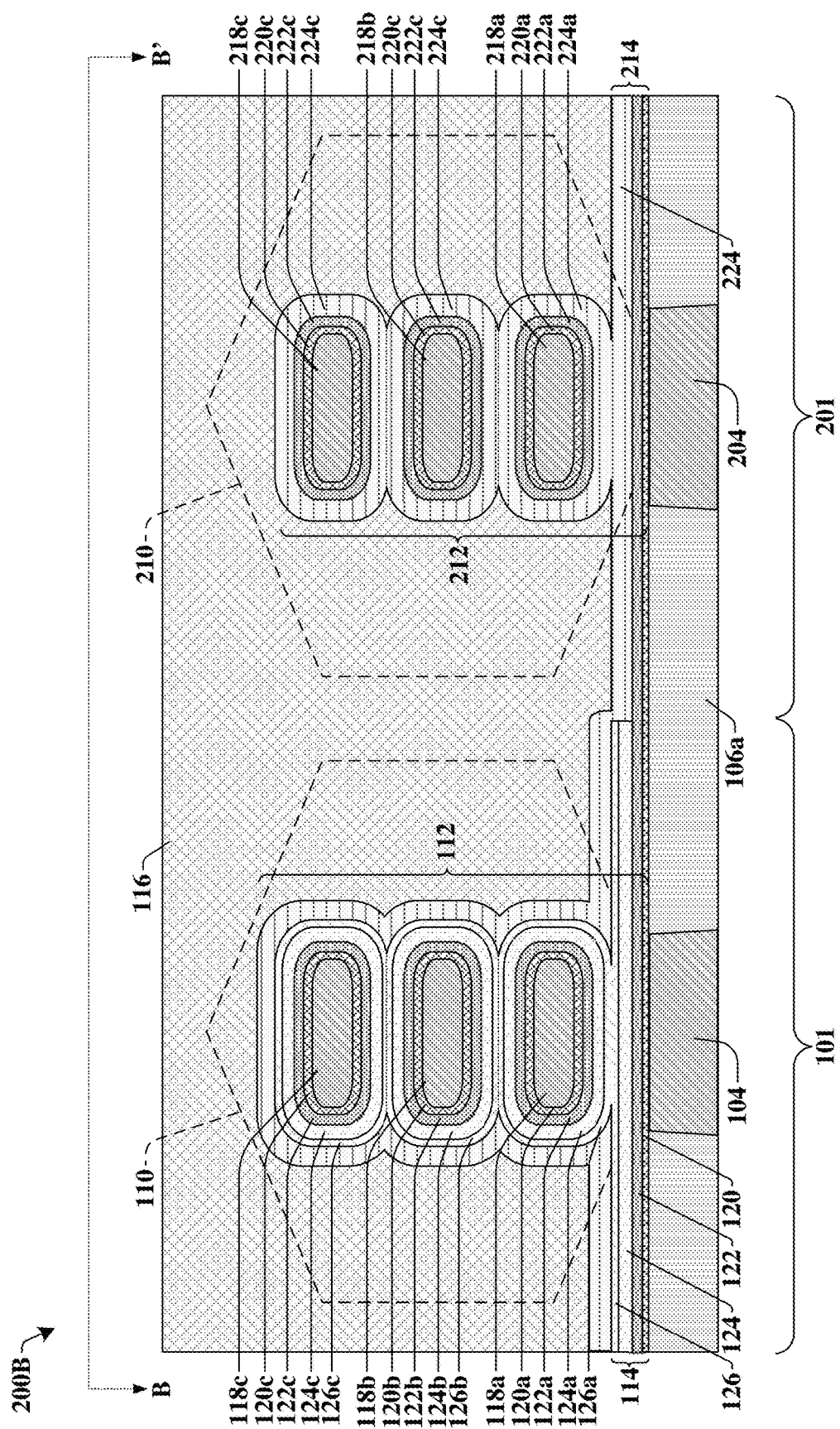

FIG. 2B illustrates a cross-sectional view 200B of some embodiments of the first NSFET 101 arranged laterally beside the second NSFET 201 that may correspond to cross-section line BB' of FIG. 2A.

As illustrated in FIG. 2B, in some embodiments, the second NSFET 201 comprises a fourth nanosheet channel structure 218a arranged directly over the second fin structure 204, a fifth nanosheet channel structure 218b arranged directly over the fourth nanosheet channel structure 218a, and a sixth nanosheet channel structure 218c arranged directly over the fifth nanosheet channel structure 218b. The second fin structure 204 and the fourth through sixth nanosheet channel structures 218a-c are spaced apart from one another by the second gate electrode structure 212. In some embodiments, the fourth nanosheet channel structure 218a, the fifth nanosheet channel structure 218b, and the sixth nanosheet channel structure 218c are respectively arranged laterally beside the first nanosheet channel structure 118a, the second nanosheet channel structure 118b, and the third nanosheet channel structure 118c. Further, in some embodiments, the first through third nanosheet channel structures 118a-c, the fourth through sixth nanosheet channel structures 218a-c, the first fin structure 104, and the second fin structure 204 comprise a same semiconductor material, such as, for example, intrinsic silicon. In other embodiments, the same semiconductor material may be doped silicon or some other suitable semiconductor material.

In some embodiments, the second gate electrode structure 212 comprises multiple second gate electrode layers 214 which may include the following: the interfacial layer 120, the gate dielectric layer 122, and a second conductive layer 224. For example, in some embodiments, the interfacial layer 120 may further comprise: a fourth interfacial ring 220a, a fifth interfacial ring 220b, and a sixth interfacial ring 220c that directly contact and continuously surround the fourth nanosheet channel structure 218a, the fifth nanosheet channel structure 218b, and the sixth nanosheet channel structure 218c, respectively. In some embodiments, the interfacial layer 120 is also arranged over the second fin structure 204. In some embodiments, the gate dielectric layer 122 may comprise a fourth dielectric ring 222a, a fifth dielectric ring 222b, and a sixth dielectric ring 222c that are arranged over and continuously surround the fourth interfacial ring 220a, the fifth interfacial ring 220b, and the sixth interfacial ring 220c, respectively. In some embodiments, the second conductive layer 224 may comprise a fourth conductive ring 224a, a fifth conductive ring 224b, and a sixth conductive ring 224c that are arranged over and continuously surround the fourth dielectric ring 222a, the fifth dielectric ring 222b, and the sixth dielectric ring 222c, respectively. In some embodiments, the fifth conductive ring 224b directly contacts the fourth conductive ring 224a and the sixth conductive ring 224c. Thus, the second conductive layer 224 is arranged directly between the second fin structure 204 and the fourth nanosheet channel structure 214a, the fourth nanosheet channel structure 214a and the fifth nanosheet channel structure 214b, and the fifth nanosheet channel structure 214b and the sixth nanosheet channel structure 214c.

In some embodiments the second conductive layer 224 may also be arranged over the first through third nanosheet channel structures 118a-c. Because the second gate electrode structure 212 comprises the second conductive layer 224 but not the first conductive layer 124 or the passivation layer 126, the second gate electrode structure 212 may have a second work function that is different than the first work function of the first gate electrode structure 112. In some embodiments, for example, the first work function of the first gate electrode structure 112 may be less than the second work function of the second gate electrode structure 212. In such embodiments, the first NSFET 101 may be an n-type NSFET, and the second NSFET 201 may be a p-type NSFET.

In some embodiments, during the formation of the first and second gate electrode structures 112, 212, a dummy masking structure (e.g., see, 1702 of FIG. 17) may be formed directly between the second fin structure 204 and the fourth nanosheet channel structure 218a, the fourth nanosheet channel structure 218a and the fifth nanosheet channel structure 218b, and the fifth nanosheet channel structure 218b and the sixth nanosheet channel structure 218c. The dummy masking structure (e.g., see, 1702 of FIG. 17) reduces the maximum dimension of the first conductive layer 124 and the passivation layer 126 arranged directly between the fourth through sixth nanosheet channel structures 218a-c for removal to prevent inadvertent over-etching of the first gate electrode structure 112 when selectively removing the first conductive layer 124 and passivation layer 126 from the fourth through sixth nanosheet channel structures 218a-c. Therefore, in some embodiments, the second NSFET 201 and the first NSFET 101 may be formed over the same substrate (102 of FIG. 2A) and may have different work functions without sacrificing the first gate electrode structure 112 of the first NSFET 101.

Figure 3:
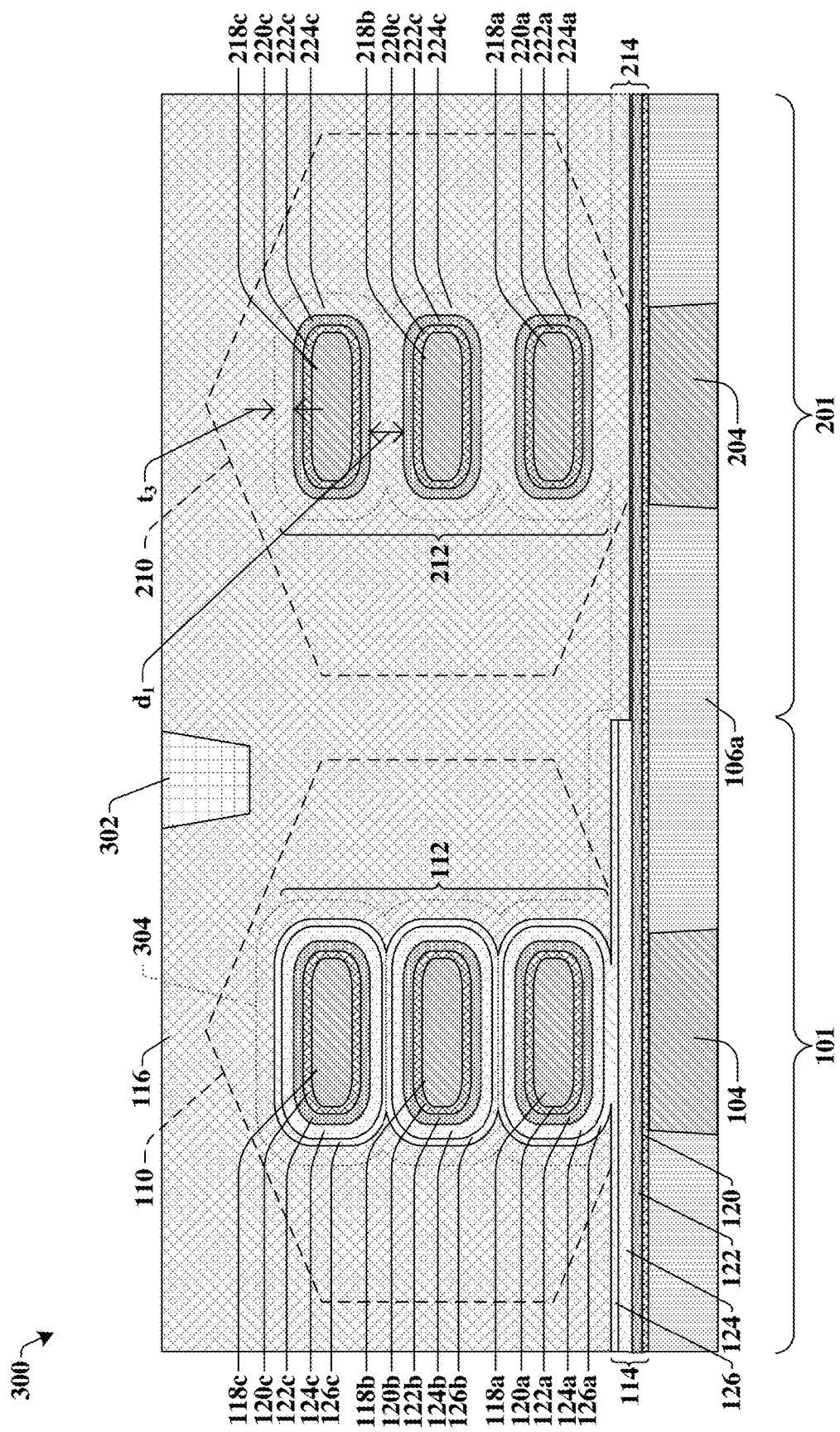
FIG. 3 illustrates a cross-sectional view of some additional embodiments of a first NSFET laterally beside a second NSFET and coupled to a contact via.

FIG. 3 illustrates a cross-sectional view 300 of some alternative embodiments of FIG. 2B wherein a first NSFET arranged beside a second NSFET and coupled to a same contact via.

In some embodiments, the glue layer 116 comprises a conductive material, such as, for example, tantalum nitride or titanium nitride, and thus, glue layer 116 is electrically coupled to the first gate electrode structure 112 and the second gate electrode structure 212. In some embodiments, a contact via 302 may be arranged over and electrically coupled to the glue layer 116, and a gate voltage may be applied to the contact via 302 to selectively turn "ON" the first NSFET 101 or the second NSFET 201. Because the first threshold voltage of the first NSFET 101 is different than the second threshold voltage of the second NSFET 201, the first NSFET 101 may be turned "ON" while the second NSFET 201 is "OFF," and vice-versa.

In some embodiments, the interfacial layer 120 may comprise an oxide, such as silicon dioxide, for example. In some embodiments, the gate dielectric layer 122 may comprise a high-k dielectric material, such as, for example, hafnium dioxide, zirconium dioxide, hafnium silicon oxide, or some other suitable dielectric material. Further, in some embodiments, the second conductive layer 224 comprises a conductive material, such as, for example, titanium nitride, tantalum nitride, tungsten carbon nitride, or some other suitable conductive material. Thus, in some embodiments, the second conductive layer 224 comprises the same material (e.g., titanium nitride) as the first conductive layer 124, whereas in other embodiments, the second conductive layer 224 comprises a different material than the first conductive layer 124.

Further, in some embodiments, the glue layer 116, the first conductive layer 124, and the second conductive layer 224 may comprise the same material (e.g., titanium nitride), whereas in other embodiments, at least one of the glue layer 116, the first conductive layer 124, or the second conductive layer 224 comprises a different material. It will be appreciated that if the glue layer 116 and the second conductive layer 224 comprise a same material, the glue layer 116 and the second conductive layer 224 may not be distinguishable between one another. Thus, in the cross-sectional view 300 of FIG. 3, an interface 304 between the glue layer 116 and the second conductive layer 224 is illustrated as a dotted line.

Further, in some embodiments, the fourth dielectric ring 222a is separated from the fifth dielectric ring 222b by the first distance $d_1$, and the fifth dielectric ring 222b is separated from the sixth dielectric ring 222c by the first distance $d_1$. In such embodiments, the second conductive layer 224 may have a third thickness $t_3$ that is greater than or equal to one-half of the first distance $d_1$. Therefore, in some embodiments, the second conductive layer 224 is thicker than the first conductive layer 124 and is thicker than the passivation layer 126.

FIGS. 4-26 illustrate various views 400-2600 of some embodiments of a method of forming a first NSFET having a first gate electrode structure arranged beside a second NSFET having a second gate electrode structure different than the first gate electrode structure. Although FIGS. 4-26 are described in relation to a method, it will be appreciated that the structures disclosed in FIGS. 4-26 are not limited to such a method, but instead may stand alone as structures independent of the method.

Figure 4:
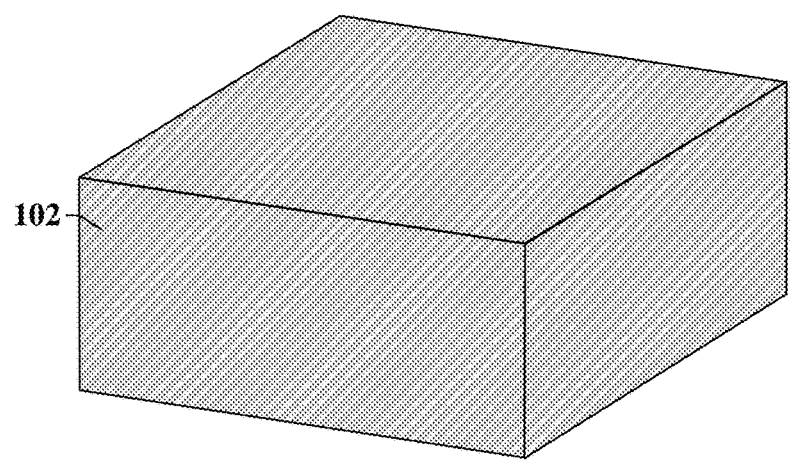
FIGS. 4-26 illustrate various views of some embodiments of a method of forming a first NSFET having a first gate electrode structure comprising a first conductive layer and a passivation layer, and using a dummy masking structure to form a second NSFET arranged laterally beside the first NSFET and having a second gate electrode structure different than the first gate electrode structure.

As shown in perspective view 400 of FIG. 4, a substrate 102 is provided. In some embodiments, the substrate 102 may be or comprise a semiconductor wafer, a semiconductor substrate, a silicon-on-insulator (SOI) substrate, or some other suitable substrate. In some embodiments, the substrate 102 may comprise a first semiconductor material such as, for example, silicon, germanium, or some other suitable semiconductor material. In such embodiments, the substrate 102 may be an intrinsic (e.g., not doped) semiconductor.

Figure 5:
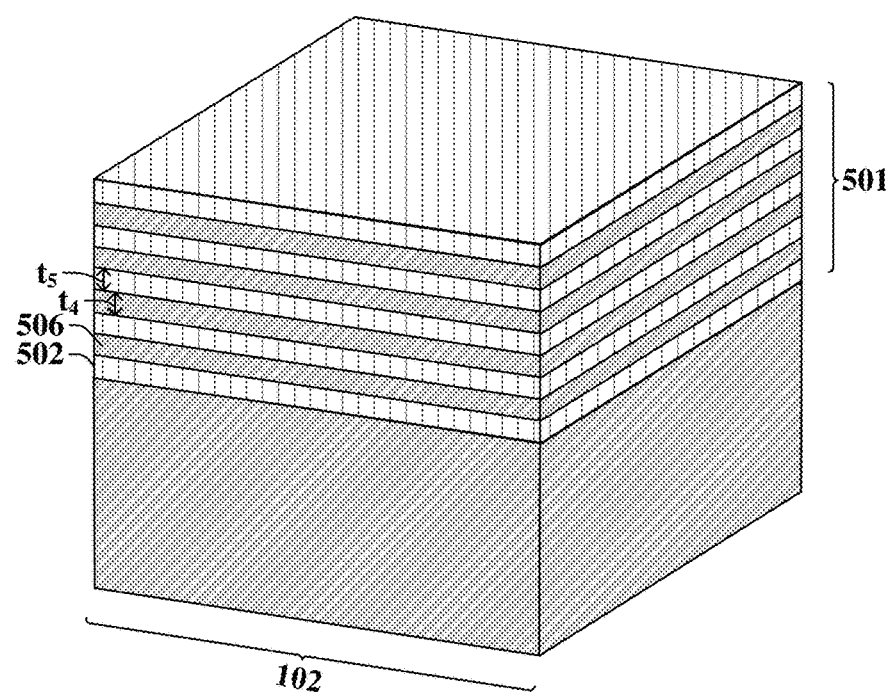

As shown in perspective view 500 of FIG. 5, in some embodiments, a stack of semiconductor layers 501 may be formed over the substrate 102. The stack may comprise a spacer layers 502 and a semiconductor layers 506, wherein the spacer layers 502 and the semiconductor layers 506 are arranged in an alternating order in the stack of semiconductor layers 501. In other words, each one of the semiconductor layers 506 is arranged between a lower one of spacer layers 502 and an upper one of the spacer layers 502. In some embodiments, the semiconductor layers 506 comprise the first semiconductor material, and the spacer layers 502 comprise a second semiconductor material that is different than the first semiconductor material. For example, in some embodiments, the first semiconductor material may comprise silicon, whereas the second semiconductor material may comprise germanium or silicon germanium. In some embodiments, the semiconductor layers 506 and the spacer layers 502 are formed by an epitaxy growth process.

Further, in some embodiments, the semiconductor layers 506 have a fourth thickness $t_4$, and the spacer layers 502 have a fifth thickness $t_5$. In some embodiments, the spacer layers 502 are removed, and the semiconductor layers 506 eventually are formed into nanosheet channel structures (e.g., see, 218 of FIG. 14A). Thus, the fifth thickness $t_5$ of the spacer layers 502 may determine the spacing of the nanosheet channel structures (e.g., see, 218 of FIG. 14A). In some embodiments, the fourth thickness $t_4$ may be in a range of between, for example, approximately 4 nanometers and approximately 8 nanometers. In some embodiments, the fifth thickness $t_5$ may be in a range of between, for example, approximately 8 nanometers and approximately 15 nanometers. Further, in some embodiments, a topmost layer of the stack of semiconductor layers 501 may be one of the spacer layers 502 to protect the semiconductor layers 506 during future processing steps. In some embodiments, it will be appreciated that although four semiconductor layers 506 are illustrated in the perspective view 500 of FIG. 5, the number of semiconductor layers 506 in the stack of semiconductor layers 501 may be less than or greater than four.

Figure 6:
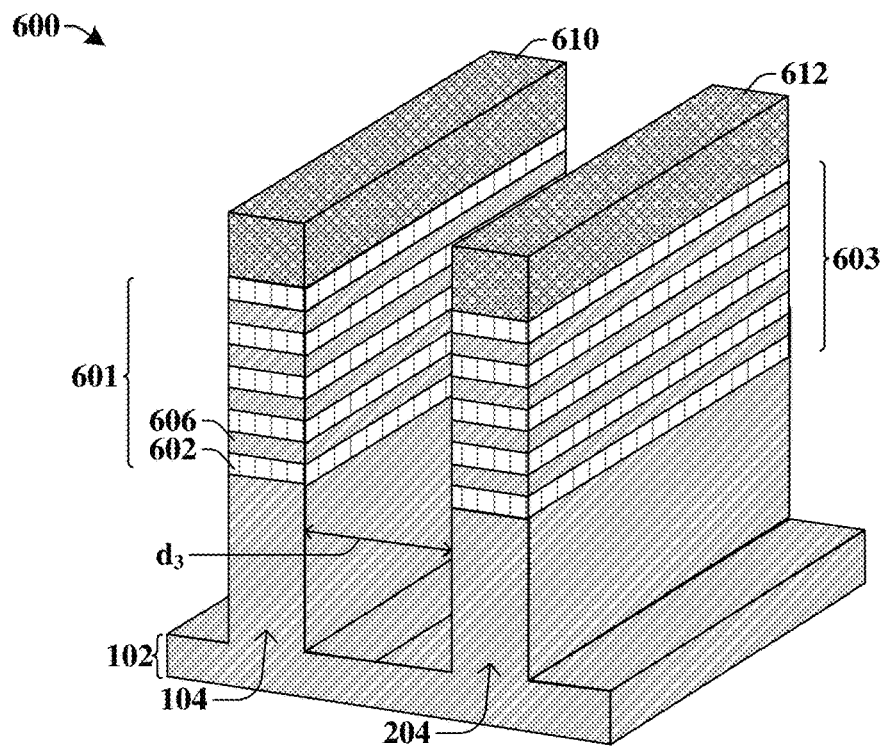

As shown in perspective view 600 of FIG. 6, in some embodiments, a first masking structure 610 and a second masking structure 612 are arranged over the stack of semiconductor layers (501 of FIG. 5). In some embodiments, the first and second masking structures 610, 612 may be formed using photolithography and removal (e.g., etching) processes. In some embodiments, the first and second masking structures 610, 612 may comprise photoresist materials or hard mask materials.

Further, as shown in perspective view 600 of FIG. 6, in some embodiments, a first removal process may be performed according to the first and second masking structures 610, 612 to form a first fin structure 104 and a second fin structure 204 from the substrate 102. In some embodiments, the first removal process may be or comprise a dry, vertical etch. The first fin structure 104 is continuously connected to the second fin structure 204 through the substrate 102, and the first fin structure 104 and the second fin structure 204 directly underlie the first masking structure 610 and the second masking structure 612. In some embodiments, the first fin structure 104 is spaced apart from the second fin structure 204 by a third distance $d_3$. In some embodiments, the third distance $d_3$ is in a range of between approximately 30 nanometers and approximately 80 nanometers, for example. Further, the first removal process removes portions of the semiconductor layers (506 of FIG. 5) and the spacer layers (502 of FIG. 5) uncovered by the first and second masking structures 610, 612. Therefore, after the first removal process, a first stack of semiconductor layers 601 comprising patterned spacer layers 602 and patterned semiconductor layers 606 is arranged over the first fin structure 104, and a second stack of semiconductor layers 603 comprising the patterned spacer layers 602 and the patterned semiconductor layers 606 is arranged over the second fin structure 204, in some embodiments. It will be appreciated that in other embodiments, wherein only one nanosheet field effect transistor (NSFET) is being formed, the first masking structure 610 may be used, and not the second masking structure 612, to form the first fin structure 104 and the first stack of semiconductor layers 601 arranged over the substrate 102.

Figure 7:
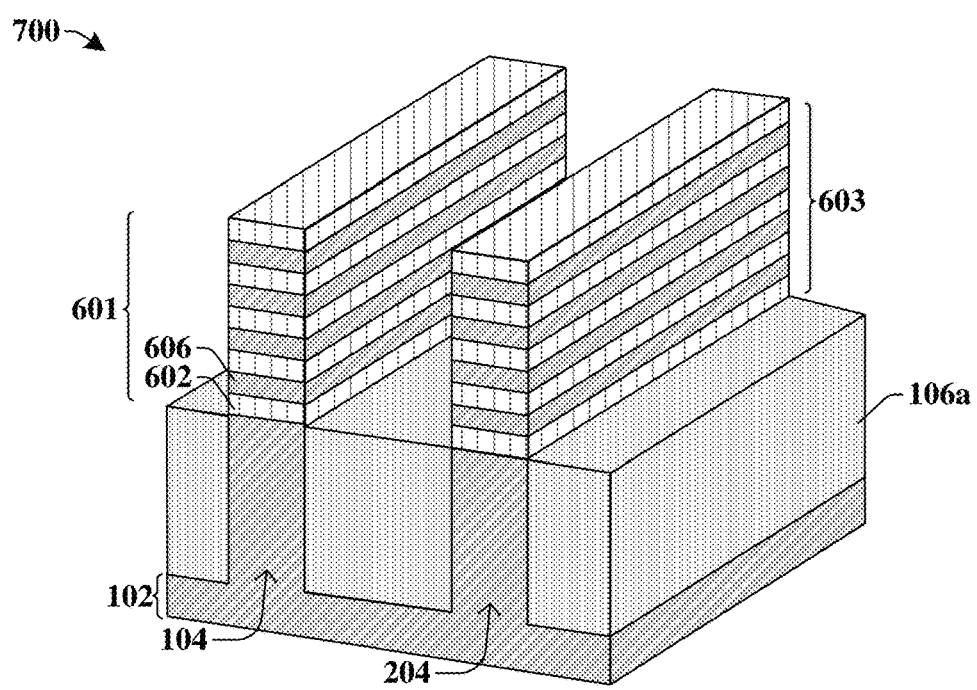

As shown in perspective view 700 of FIG. 7, in some embodiments, a lower isolation structure 106a may be formed over the substrate 102 and between the first fin structure 104 and the second fin structure 204. The lower isolation structure 106a may provide electrical isolation between the first fin structure 104 and the second fin structure 204. In some embodiments, the lower isolation structure 106a may comprise a dielectric material such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like.

In some embodiments, the lower isolation structure 106a is formed through various steps comprising a thermal oxidation or deposition process (e.g., physical vapor deposition (PVD), chemical vapor deposition (CVD), PE-CVD, atomic layer deposition (ALD), sputtering, etc.), and removal processes (e.g., wet etching, dry etching, chemical mechanical planarization (CMP), etc.). For example, in some embodiments, a dielectric material is deposited over the substrate 102 and the first and second masking structures (610, 612 of FIG. 6). Then, in some embodiments, a removal process, such as CMP, is used to remove portions of the dielectric material and the first and second masking structures (610, 612 of FIG. 6), thereby exposing the first and second stacks of semiconductor layers 601, 603. Then, in some embodiments, another removal process, such as a vertical, dry etch, may be performed to remove portions of the dielectric material surrounding the first and second stacks of semiconductor layers 601, 603 to form the lower isolation structure 106a. It will be appreciated that other processes and/or order of steps to form the lower isolation structure 106a is also within the scope of the disclosure.

Figure 8:
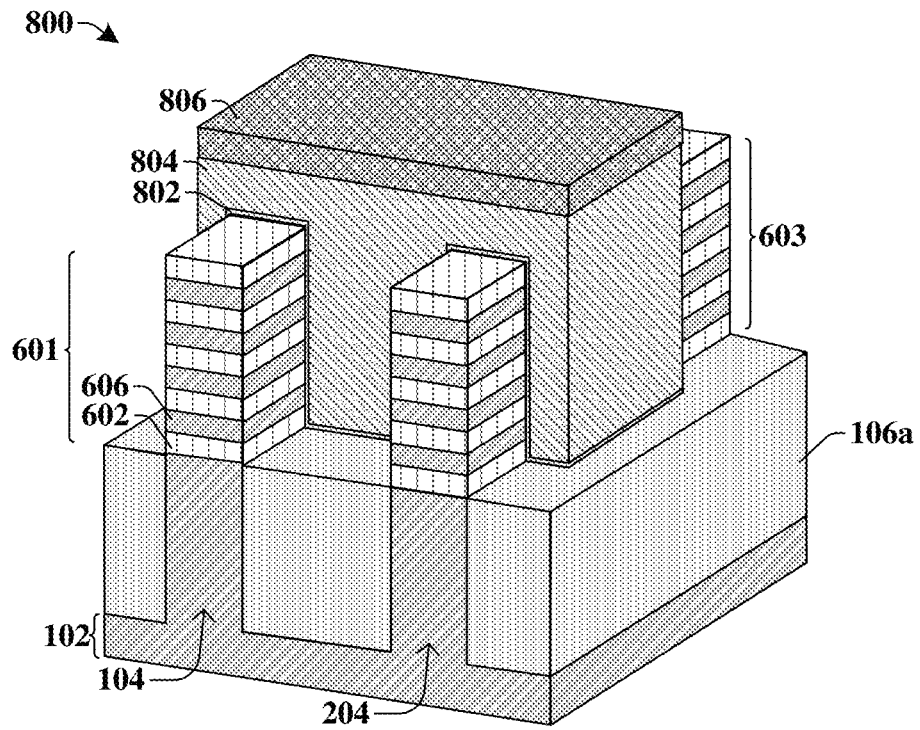

As shown in perspective view 800 of FIG. 8, a dummy gate structure 804 may be formed over the first and second stacks of semiconductor layers 601, 603. In some embodiments, a dummy interfacial layer 802 separates the first and second stacks of semiconductor layers 601, 603 from the dummy gate structure 804, and a third masking structure 806 is arranged over the dummy gate structure 804. In some embodiments, to form the dummy gate structure 804, a dummy interfacial material of the dummy interfacial layer 802 is first formed over the first and second stacks of semiconductor layers 601, 603. In some embodiments, the dummy interfacial layer 802 may comprise, for example, a dielectric material such as a nitride (e.g., silicon nitride, silicon oxynitride), a carbide (e.g., silicon carbide), an oxide (e.g., silicon oxide), or some other suitable material. Then, in some embodiments, a dummy gate material of the dummy gate structure 804, such as, for example, polysilicon, is formed over the dummy interfacial material. The dummy gate material and/or the dummy interfacial material may be formed by way of a thermal oxidation process and/or a deposition process (e.g., PVD, CVD, PE-CVD, ALD, etc.). In some embodiments, the third masking structure 806 is formed over the dummy gate material and directly overlies the first and second stacks of semiconductor layers 601, 603. In some embodiments, the third masking structure 806 may be formed using photolithography and removal (e.g., etching) processes. In some embodiments, the third masking structure 806 may comprise photoresist materials or hard mask materials. After the formation of the third masking structure 806, a removal process (e.g., etching) may be performed to remove portions of the dummy gate material and the dummy interfacial material that do not directly underlie the third masking structure 806, thereby forming the dummy gate structure 804 and the dummy interfacial layer 802, respectively.

Figure 9:
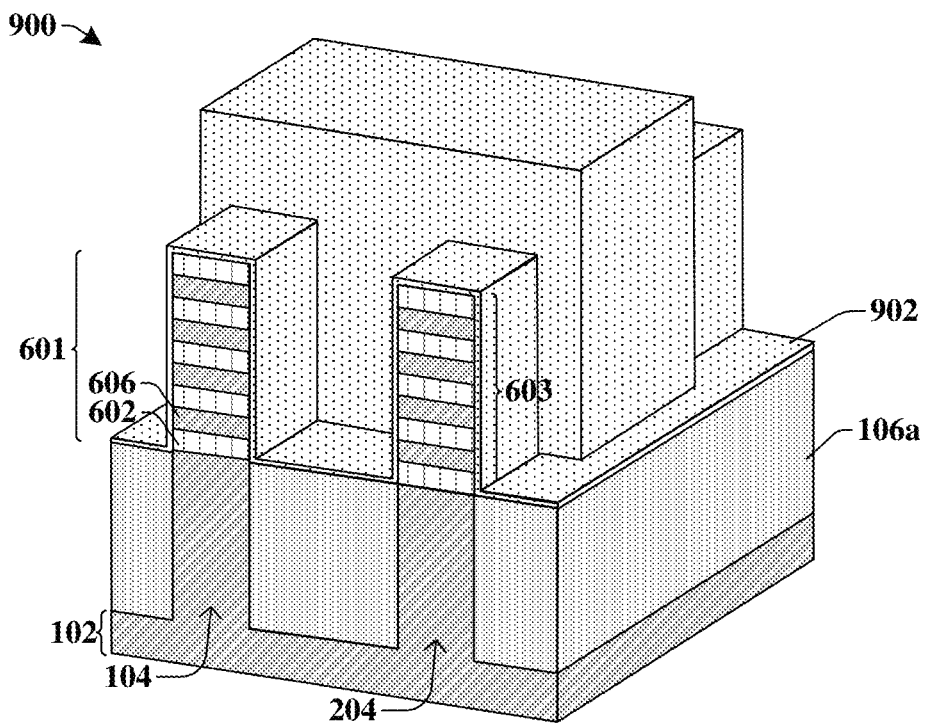

As shown in perspective view 900 of FIG. 9, in some embodiments, a gate spacer layer 902 may be formed over the lower isolation structure 106a, the first stack of semiconductor layers 601, the second stack of semiconductor layers 603, and the dummy gate structure (804 of FIG. 8). In some embodiments, the gate spacer layer 902 may be or comprise a dielectric material such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. Further, in some embodiments, the gate spacer layer 902 may be deposited by way of a deposition process (e.g., PVD, CVD, PE-CVD, ALD, sputtering, etc.). It will be appreciated that other materials and/or ways of forming the gate spacer layer 902 are also within the scope of the disclosure.

Figure 10:
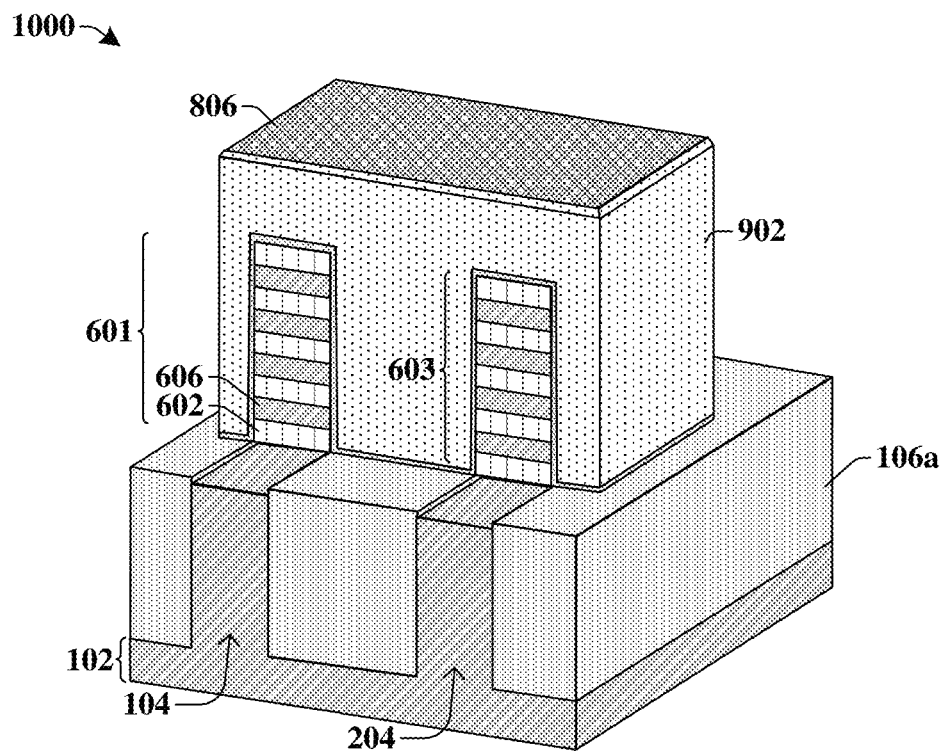

As shown in perspective view 1000 of FIG. 10, in some embodiments, a second removal process may be performed to remove portions of the gate spacer layer 902, the first stack of semiconductor layers 601, and the second stack of semiconductor layers 603 that do not directly underlie the third masking structure 806. In some embodiments, the second removal process may be or comprise an etching process. In some embodiments, a single etchant may be used to remove the gate spacer layer 902, the first stack of semiconductor layers 601, and the second stack of semiconductor layers 603, whereas in other embodiments, multiple etchants may be used to perform the second removal process. After the second removal process, the first fin structure 104 and the second fin structure 204 are exposed. In some embodiments, upper portions of the lower isolation structure 106a, the first fin structure 104, the second fin structure 204, and/or the third masking structure 806 may be residually removed by the second removal process. Thus, in some embodiments, after the second removal process, the first fin structure 104 and the second fin structure 204 may have upper surfaces below an upper surface of the lower isolation structure 106a.

Figure 11:
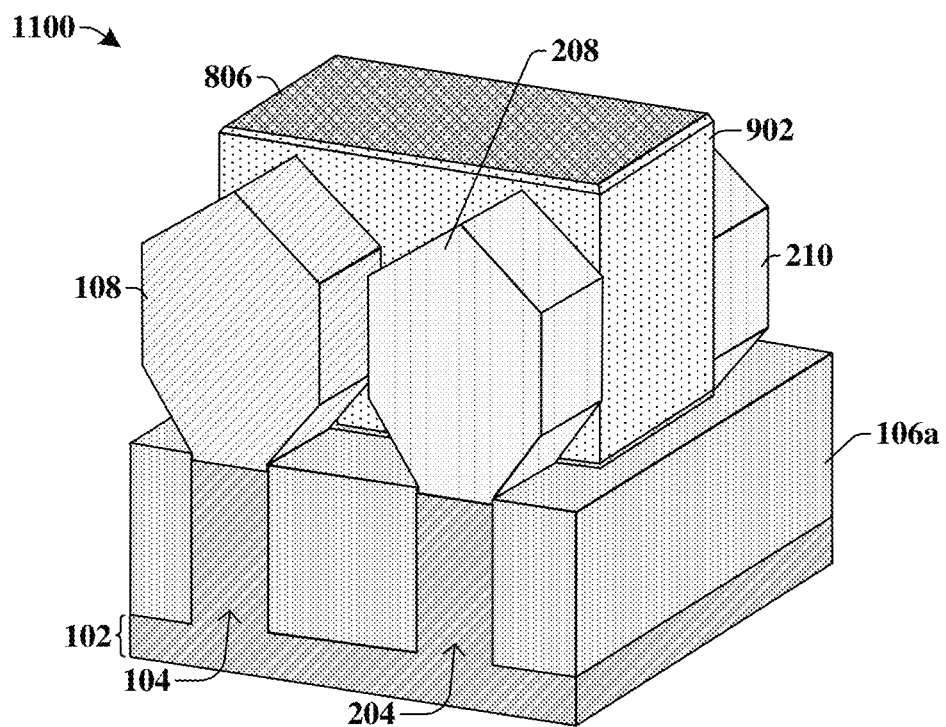

As shown in perspective view 1100 of FIG. 11, in some embodiments, an epitaxial growth process may be performed to form a first source/drain region 108 and a second source/drain region (not shown) on the first fin structure 104 and to form a third source/drain region 208 and a fourth source/drain region 210 on the second fin structure 204. The first source/drain region 108, the second source/drain region (not shown), the third source/drain region 208, and the fourth source/drain region 210 may comprise a third semiconductor material. In some embodiments, the third semiconductor material may be doped silicon, for example. Thus, in some embodiments, the first fin structure 104, the second fin structure 204, the first source/drain region 108, the second source/drain region (not shown), the third source/drain region 208, and the fourth source/drain region 210 may comprise silicon. In some embodiments, the first source/drain region 108 and the second source/drain region (not shown) may have a first doping type, whereas the third source/drain region 208 and the fourth source/drain region 210 may have a second doping type that is different than the first doping type. For example, in some embodiments, the first doping type may be n-type whereas the second doping type may be p-type. In some embodiments, due to the epitaxial growth process, the first source/drain region 108, the second source/drain region (not shown), the third source/drain region 208, and the fourth source/drain region 210 may exhibit a hexagonal shape, a diamond shape, or some other geometric shape. Further, in some embodiments, the first source/drain region 108, the second source/drain region (not shown), the third source/drain region 208, and the fourth source/drain region 210 do not directly contact one another.

Figure 12:
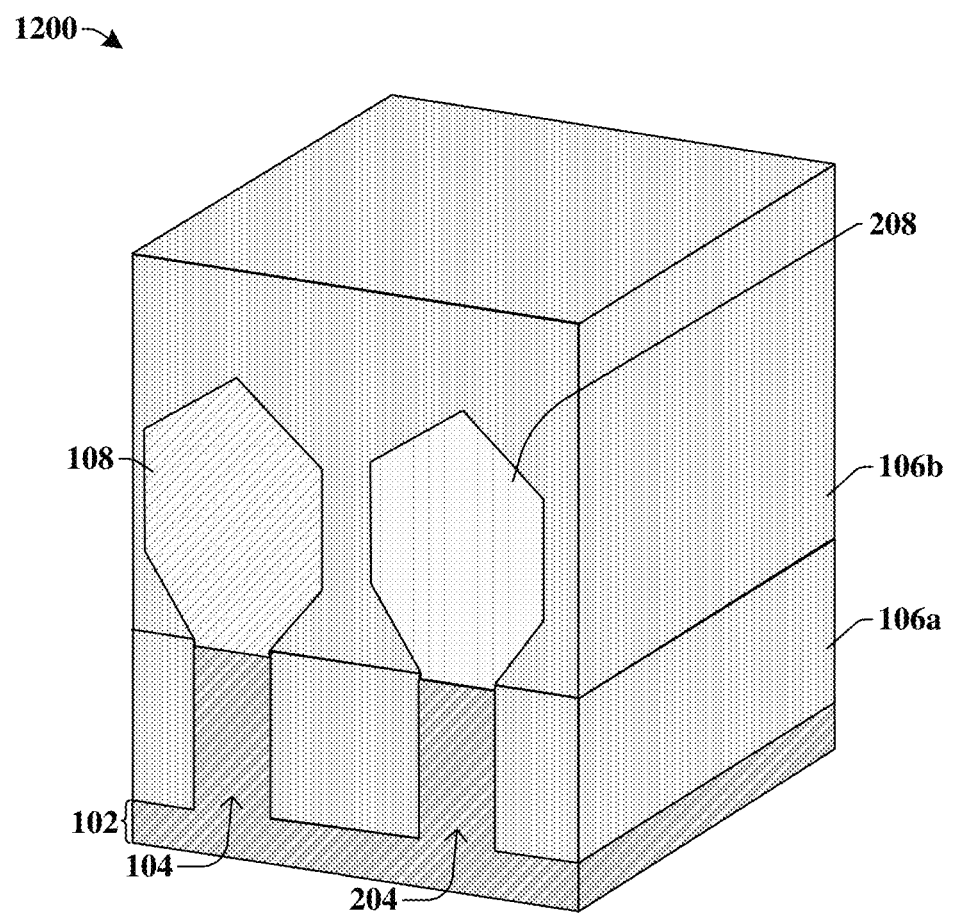

As shown in the perspective view 1200 of FIG. 12, in some embodiments, an upper isolation structure 106b is formed over the lower isolation structure 106a, the first source/drain region 108, the second source/drain region (not shown), the third source/drain region 208, and the fourth source/drain region 210. In some embodiments, the upper isolation structure 106b comprises a dielectric material such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. The upper isolation structure 106b may provide electrical isolation between the first source/drain region 108, the second source/drain region (not shown), the third source/drain region 208, and the fourth source/drain region (210 of FIG. 11), in some embodiments. In some embodiments, the upper isolation structure 106b is formed by way of a deposition process (e.g., PVD, CVD, PE-CVD, ALD, sputtering, etc.). Further, in some embodiments, prior to the formation of the upper isolation structure 106b, an etch stop layer (not shown) may be formed over the lower isolation structure 106a, first source/drain region 108, the second source/drain region (not shown), the third source/drain region 208, the fourth source/drain region (210 of FIG. 11).

Figure 13:
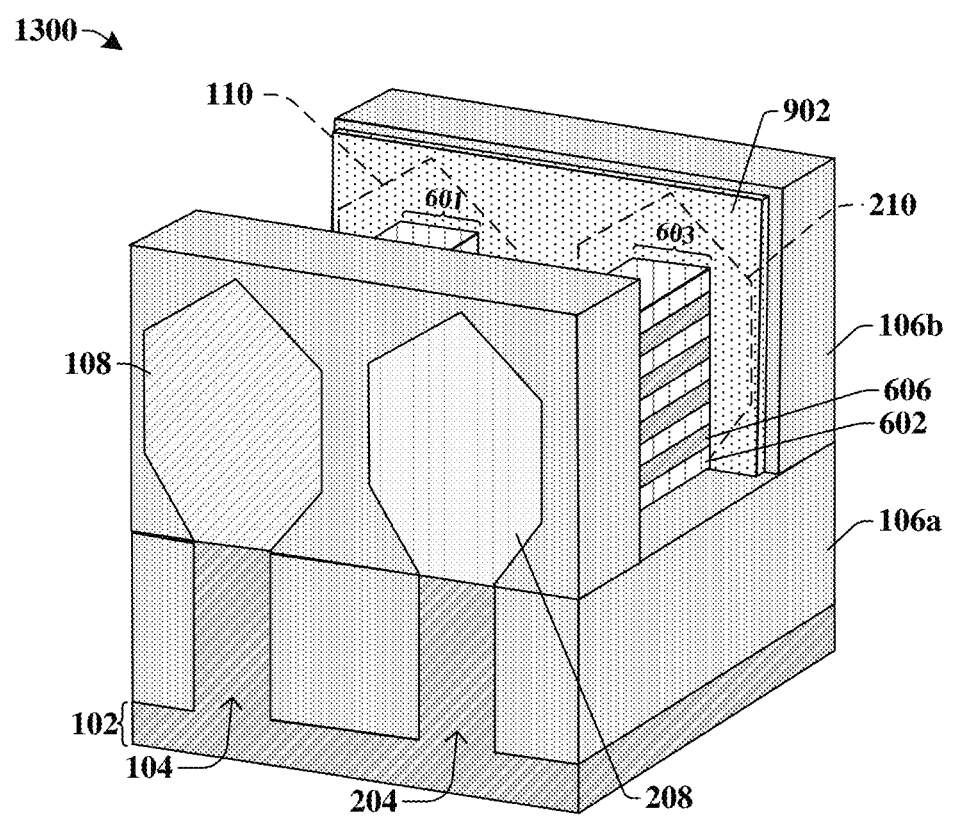

As shown in perspective view 1300 of FIG. 13, in some embodiments, a third removal process is performed to remove the third masking structure (806 of FIG. 8), the dummy gate structure (804 of FIG. 8), and the dummy interfacial layer (802 of FIG. 8) from the first stack of semiconductor layers 601 and the second stack of semiconductor layers 603. In some embodiments, the third removal process comprises a CMP step and/or an etching step. For example, in some embodiments, the third removal process first includes a CMP step to remove upper portions of the upper isolation structure 106b and to completely remove the third masking structure (806 of FIG. 8) to expose the dummy gate structure (804 of FIG. 8). In some embodiments, the third removal process further includes performing an etching step to completely remove the dummy gate structure (804 of FIG. 8) to expose the first stack of semiconductor layers 601 and the second stack of semiconductor layers 603. It will be appreciated that the second source/drain region 110 and the fourth source/drain region 210 are arranged behind the gate spacer layer 902 and thus, are illustrated with dotted lines.

Figure 14A:
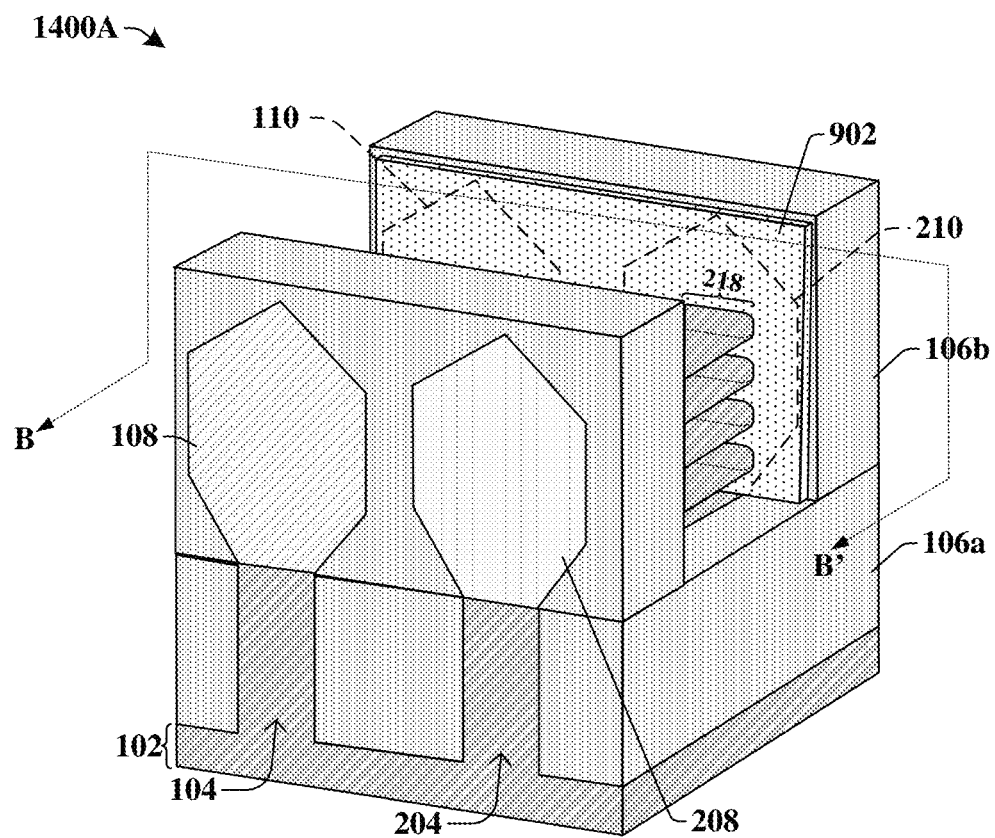

As shown in perspective view 1400A of FIG. 14A, in some embodiments, a fourth removal process is performed to remove the patterned spacer layers (602 of FIG. 13) from the first stack of semiconductor layers (601 of FIG. 13) and to remove the patterned spacer layers (602 of FIG. 13) from the second stack of semiconductor layers (603 of FIG. 13). In some embodiments, the fourth removal process comprises an isotropic etching step such that the patterned spacer layers (602 of FIG. 13) from the first and second stack of semiconductor layers (601, 603 of FIG. 13) can be completely removed from between the patterned semiconductor layers (606 of FIG. 13). In some embodiments, the fourth removal process may comprise a wet etchant or a dry etchant. After the fourth removal process, a first stack of nanosheet channel structures (see, 118 of FIG. 14B) comprising the patterned semiconductor layers (606 of FIG. 13) extend from the first source/drain region 108 to the second source/drain region 110, and in some embodiments, a second stack of nanosheet channel structures 218 comprising the patterned semiconductor layers (606 of FIG. 13) extend from the third source/drain region 208 to the fourth source/drain region 210.

Figure 14B:
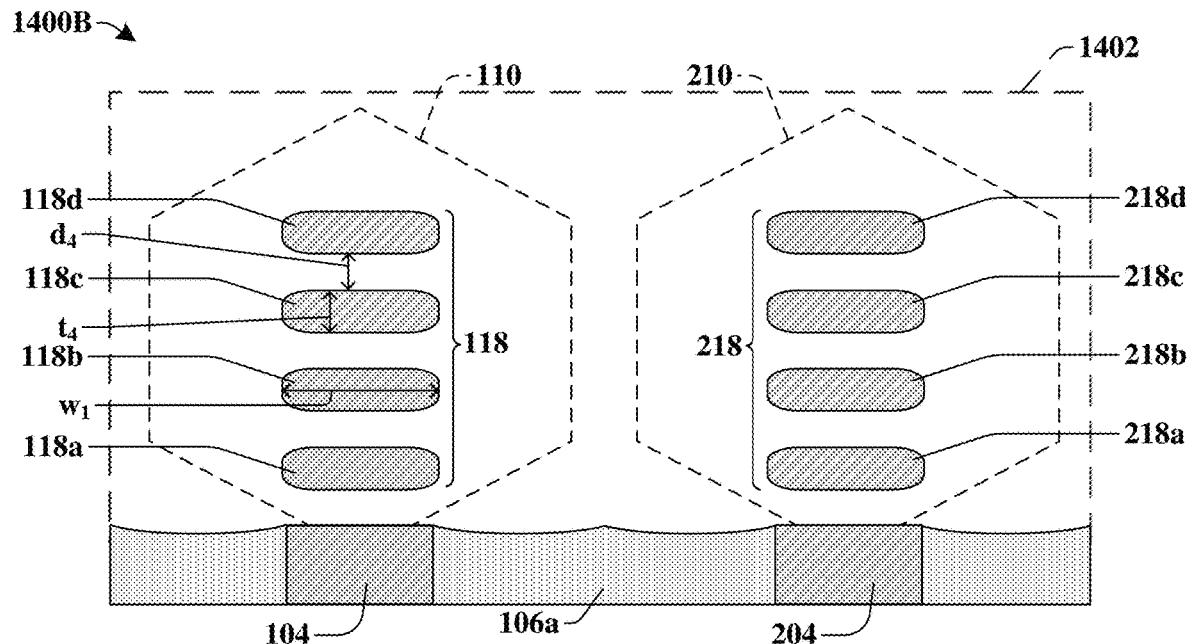

FIG. 14B illustrates a cross-sectional view 1400B of some embodiments that may correspond to cross-section line BB' of FIG. 14A.

As shown in the cross-sectional view 1400B of FIG. 14B, in some embodiments, after the fourth removal process, a first stack of nanosheet channel structures 118 is arranged over the first fin structure 104, and the second stack of nanosheet channel structures 218 is arranged over the second fin structure 204. In some embodiments, the first stack of nanosheet channel structures 118 comprises a first nanosheet channel structure 118a, a second nanosheet channel structure 118b, a third nanosheet channel structure 118c, and a fourth nanosheet channel structure 118d. In some embodiments, the second stack of nanosheet channel structures 218 comprises a fifth nanosheet channel structure 218a, a sixth nanosheet channel structure 218b, a seventh nanosheet channel structure 218c, and an eighth nanosheet channel structure 218d. Thus, in some embodiments, the first stack of nanosheet channel structures 118 comprises four nanosheet channel structures, and the second stack of nanosheet channel structures 218 comprises four nanosheet channel structures. It will be appreciated that in other embodiments, the first and second stacks of nanosheet channel structures 118, 218 may each comprise more or less than four nanosheet channel structures.

In some embodiments, after the fourth removal process, the first through eighth nanosheet channel structures 118a-d, 218a-d exhibit an elongated oval-like shape or rectangular shape with rounded corners from the cross-sectional view 1400B. In some embodiments, the rounded corners are a result of the fourth removal process. In other embodiments, the first through eighth nanosheet channel structures 118a-d, 218a-d may exhibit a circle, square, rectangle, hexagon, oval, diamond, or some other geometric shape from the cross-sectional view 1400B after the fourth removal process.

Further, in some embodiments, the first through fourth nanosheet channel structures 118a-d are spaced apart from one another by a fourth distance $d_4$, and the fifth through eighth nanosheet channel structures 218a-d are also spaced apart from one another by the fourth distance $d_4$. For example, the fourth distance $d_4$ is the distance between an upper surface of the third nanosheet channel structure 118c and a lower surface of the fourth nanosheet channel structure 118d. In some embodiments, the fourth distance $d_4$ is in a range of between approximately 8 nanometers and approximately 15 nanometers, for example. Thus, in some embodiments, the fifth thickness ($t_5$ of FIG. 5) of the spacer layers (502 of FIG. 5) determines the fourth distance $d_4$. Further, in some embodiments, the first through fourth nanosheet channel structures 118a-d and the fifth through eighth nanosheet channel structures 218a-d each have a fourth thickness $t_4$. In some embodiments, the fourth thickness $t_4$ may be in a range of between, for example, approximately 4 nanometers and approximately 8 nanometers. Thus, the fourth thickness $t_4$ of the semiconductor layers 506 determine the fourth thickness $t_4$ of the first through eighth nanosheet channel structures 118a-d, 218a-d, in some embodiments. Further, in some embodiments, the first through eighth nanosheet channel structures 118a-d, 218a-d may have a first width $w_1$ that is in a range of between, for example, approximately 40 nanometers and approximately 60 nanometers. It will be appreciated that other values for the fourth distance $d_4$, the fourth thickness $t_4$, and the first width $w_1$ are also within the scope of the disclosure.

It will be appreciated that for ease of illustration, a generic layer 1402 is illustrated behind the first and second stacks of nanosheet channel structures 118, 218 and in front of the second and fourth source/drain regions 110, 210. For example, from the perspective view 1400A of FIG. 14A, it can be understood that in the cross-sectional view 1400B of FIG. 14B, the generic layer 1402 represents the gate spacer layer 902, in some embodiments. The generic layer 1402 is illustrated as a white box with a hashed outline. This way, in future processing steps, layers formed around the first and second stacks of nanosheet channel structures 118, 218 may be more easily visible.

Further, it will be appreciated that within this disclosure, the identifiers for nanosheet channel structures (e.g., 118a, 118b, 218a, 218b, etc.), interfacial rings (e.g., 120a, 120b, 220a, 220b, etc.), dielectric rings (e.g., 122a, 122b, etc.), and conductive rings (e.g., 124a, 124b, 224a, 224b, etc.) are generic identifiers and may vary between Figure descriptions. For example, in FIG. 2B, a fourth nanosheet channel structure is identified as "218a," whereas in FIG. 14B, "218a" identifies a fifth nanosheet channel structure.

Figure 15:
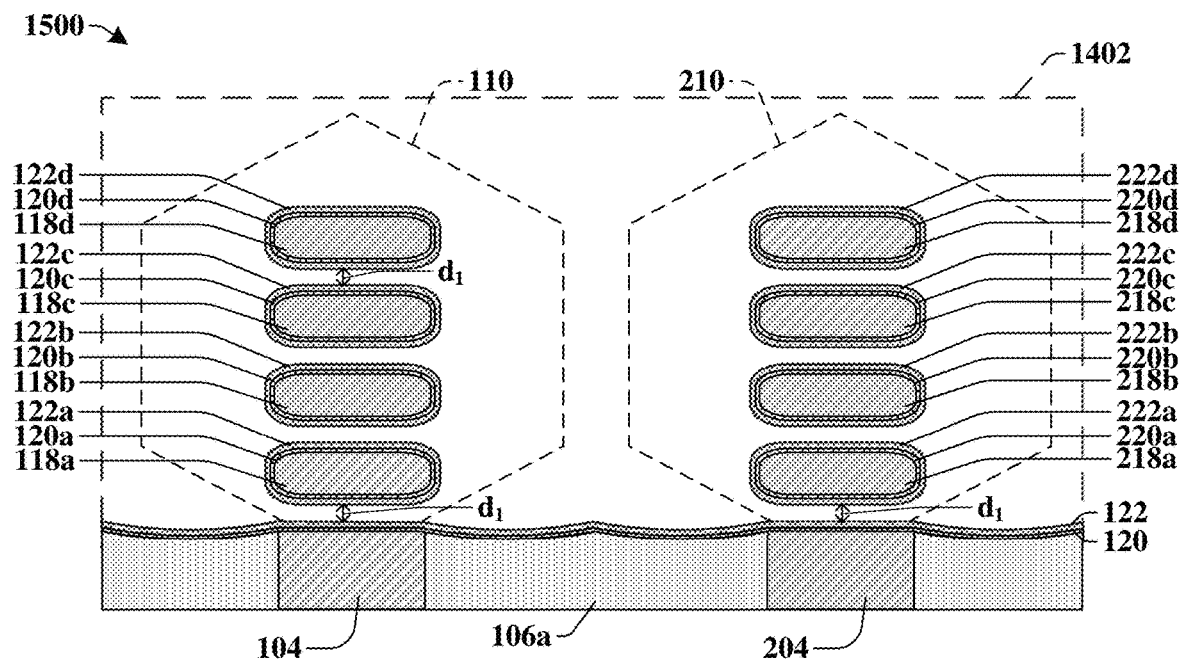

As shown in cross-sectional view 1500 of FIG. 15, in some embodiments, an interfacial layer 120 is formed over the first and second fin structures 104, 204 and around the first through eighth nanosheet channel structures 118a-d, 218a-d. In some embodiments, the interfacial layer 120 may comprise, for example, an oxide such as silicon dioxide. In such embodiments, the interfacial layer 120 may be formed by way of a thermal oxidation process or by other deposition processes (e.g., CVD, PVD, PE-CVD, ALD, sputtering, etc.). In some embodiments the interfacial layer 120 may have a thickness in a range of between approximately 8 angstroms and approximately 15 angstroms, for example. In some embodiments, the interfacial layer 120 comprises a first interfacial ring 120a, a second interfacial ring 120b, a third interfacial ring 120c, a fourth interfacial ring 120d, a fifth interfacial ring 220a, a sixth interfacial ring 220b, a seventh interfacial ring 220c, and an eighth interfacial ring 220d that directly contacts and continuously surrounds the first nanosheet channel structure 118a, the second nanosheet channel structure 118b, the third nanosheet channel structure 118c, the fourth nanosheet channel structure 118d, the fifth nanosheet channel structure 218a, the sixth nanosheet channel structure 218b, the seventh nanosheet channel structure 218c, and the eighth nanosheet channel structure 218d, respectively.

Further, in some embodiments, a gate dielectric layer 122 is formed over the interfacial layer 120. In some embodiments, the gate dielectric layer 122 may comprise a high-k dielectric material, such as, for example, hafnium dioxide, zirconium dioxide, hafnium silicon oxide, or some other suitable dielectric material. In some embodiments, the gate dielectric layer 122 may be formed by way of a deposition process (e.g., CVD, PVD, PE-CVD, ALD, sputtering, etc.). In some embodiments the gate dielectric layer 122 may have a thickness in a range of between approximately 10 angstroms and approximately 20 angstroms, for example. In some embodiments, the gate dielectric layer 122 comprises a first dielectric ring 122a, a second dielectric ring 122b, a third dielectric ring 122c, a fourth dielectric ring 122d, a fifth dielectric ring 222a, a sixth dielectric ring 222b, a seventh dielectric ring 222d, and an eighth dielectric ring 222d that continuously surrounds the first nanosheet channel structure 118a, the second nanosheet channel structure 118b, the third nanosheet channel structure 118c, the fourth nanosheet channel structure 118d, the fifth nanosheet channel structure 218a, the sixth nanosheet channel structure 218b, the seventh nanosheet channel structure 218c, and the eighth nanosheet channel structure 218d, respectively. In some embodiments, the interfacial layer 120 and the gate dielectric layer 122 may also be formed over the gate spacer layer (902 of FIG. 14A). In such embodiments, after the formation of the interfacial layer 120 and the gate dielectric layer 122, the generic layer 1402 may represent the gate dielectric layer 122.

After the formation of the interfacial layer 120 and the gate dielectric layer 122, in some embodiments, a first distance $d_1$ remains between nearest neighboring first through eighth dielectric rings 122a-122d, 222a-222d. For example, the first dielectric ring 122a directly overlies the gate dielectric layer 122 arranged over the first fin structure 104, and the first dielectric ring 122a is spaced apart from the gate dielectric layer 122 arranged over the first fin structure 104 by the first distance $d_1$. Further, for example, the fourth dielectric ring 122d directly overlies the third dielectric ring 122c, and the fourth dielectric ring 122d is spaced apart from the third dielectric ring 122c by the first distance $d_1$. In some embodiments, the first distance $d_1$ is in a range of between, for example, approximately 4 nanometers and approximately 6 nanometers.

Figure 16:
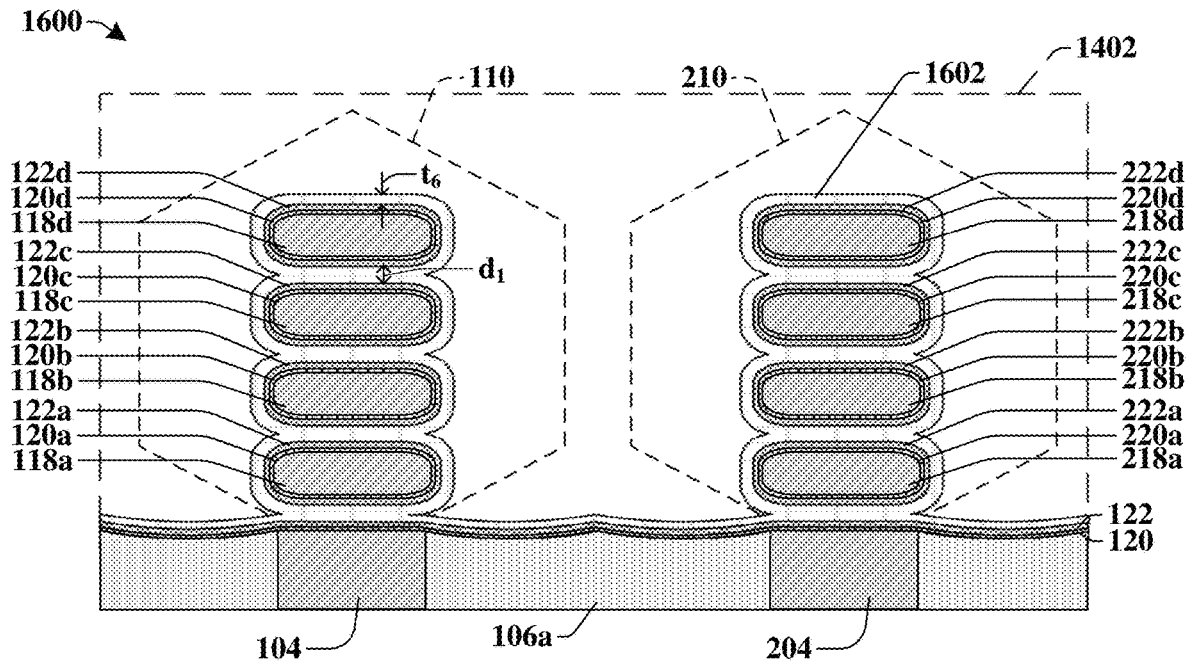

As shown in cross-sectional view 1600 of FIG. 16, in some embodiments, a dummy masking layer 1602 is formed over the first fin structure 104, the second fin structure 204, and the first through eighth nanosheet channel structures 118a-d, 218a-d. In some embodiments, the dummy masking layer 1602 comprises aluminum oxide. It will be appreciated that other materials for the dummy masking layer 1602 are also within the scope of the disclosure. In some embodiments, the dummy masking layer 1602 may be formed by way of a deposition process (e.g., CVD, PVD, PE-CVD, ALD, sputtering, etc.). The dummy masking layer 1602 is formed to completely cover the first fin structure 104, the second fin structure 204, and the first through eighth nanosheet channel structures 118a-d, 218a-d. In some embodiments, the dummy masking layer 1602 has a sixth thickness $t_6$, and the sixth thickness $t_6$ is at least equal to one-half of the first distance $d_1$. Thus, the dummy masking layer 1602 completely fills in the space directly between the nearest neighboring first through eighth dielectric rings 122a-122d, 222a-222d. For example, the dummy masking layer 1602 is arranged in the space directly between the fourth dielectric ring 122d and the third dielectric ring 122c, in some embodiments.

Figure 17:
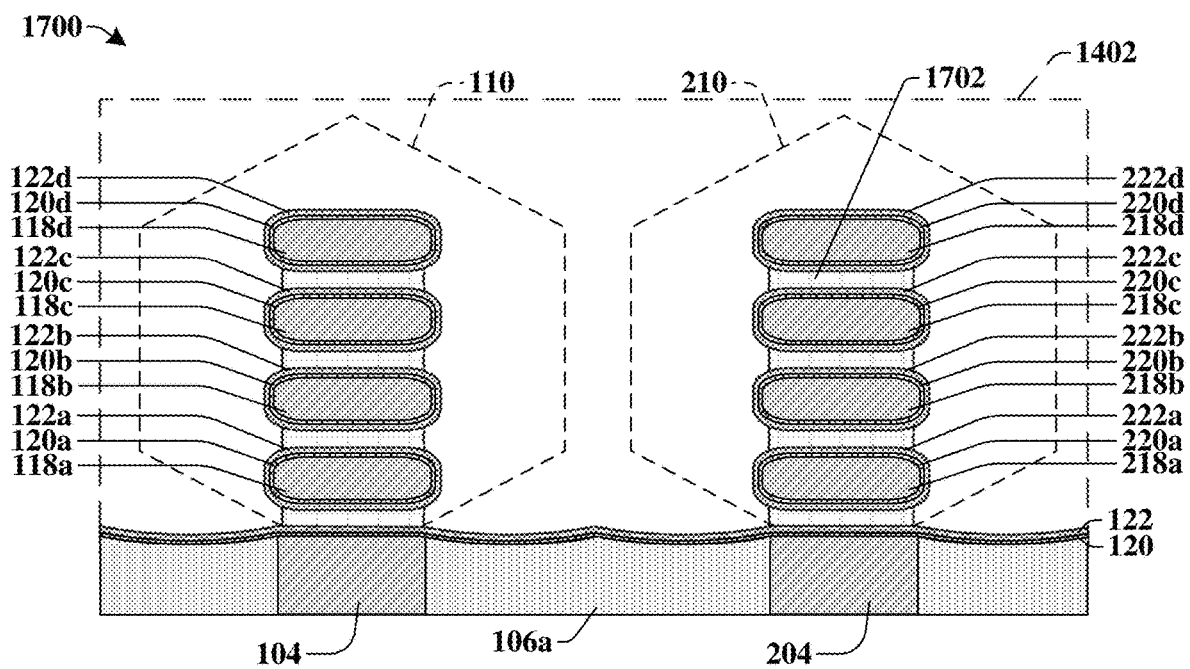

As shown in cross-sectional view 1700 of FIG. 17, in some embodiments, a fifth removal process is performed to remove outer portions of the dummy masking layer (1602 of FIG. 16), thereby forming a dummy masking structure 1702. Thus, in some embodiments, after the fifth removal process, the dummy masking structure 1702 is arranged at least directly between the second fin structure 204 and the fifth nanosheet channel structure 218*a*, directly between the fifth nanosheet channel structure 218*a* and the sixth nanosheet channel structure 218*b*, directly between the sixth nanosheet channel structure 218*b* and the seventh nanosheet channel structure 218*c*, and directly between the seventh nanosheet channel structure 218*c* and the eighth nanosheet channel structure 218*d*.

In some embodiments, the fifth removal process may comprise a wet etch that is isotropic. For example, in some embodiments, the fifth removal process may comprise an ammonium hydroxide solution that selectively removes the dummy masking layer (1602 of FIG. 16) and does not remove the gate dielectric layer 122. Thus, in some embodiments, the material of the dummy masking layer (1602 of FIG. 16) is a material that may be selectively removed by a certain wet etchant, while that certain wet etchant does not remove the material of the gate dielectric layer 122. Therefore, other materials of the dummy masking layer (1602 of FIG. 16) and other etchants of the fifth removal process are also within the scope of the disclosure. Further, in some embodiments, the fifth removal process is performed for a time period that removes at least the sixth thickness $t_6$ of the dummy masking layer (1602 of FIG. 16). Thus, the dummy masking structure 1702 remains between the first fin structure 104, the second fin structure 204, and the first through eighth nanosheet channel structures 118*a-d*, 218*a-d*, as illustrated in the cross-sectional view 1700 of FIG. 17.

Figure 18:
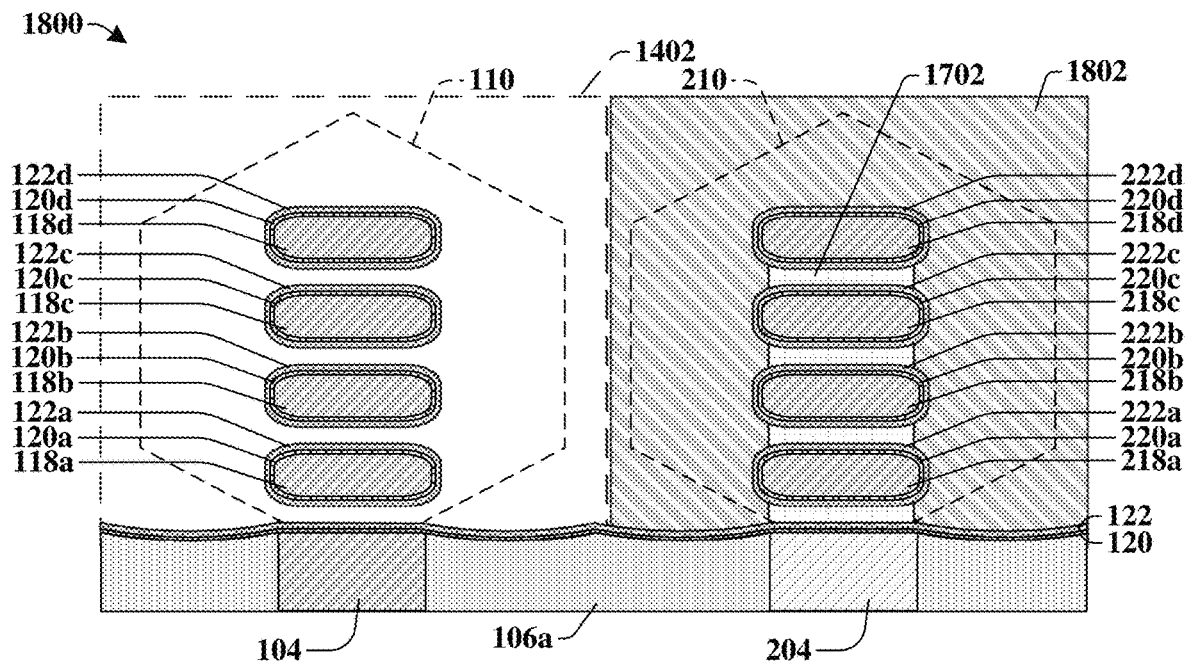

As shown in cross-sectional view 1800 of FIG. 18, in some embodiments, a fourth masking structure 1802 is formed over the second fin structure 204 and the fifth through eighth nanosheet channel structures 218*a-d*. The fourth masking structure 1802 does not directly overlie the first fin structure 104 or the first through fourth nanosheet channel structures 118*a-d*. In some embodiments, the fourth masking structure 1802 may be formed using deposition (e.g., spin-coating), photolithography and removal (e.g., etching) processes. For example, in some embodiments, the fourth masking structure 1802 may be or comprise a bottom anti-reflective coating (BARC), an anti-reflective coating (ARC), or some other suitable photoresist material. In some other embodiments, the fourth masking structure 1802 may be or comprise a hard mask material.

After the formation of the fourth masking structure 1802, in some embodiments, a sixth removal process is performed to remove the dummy masking structure 1702 that is uncovered by the fourth masking structure 1802. In some embodiments, the sixth removal process comprises the same wet etchant as the fifth removal process because the same dummy masking material is being removed. Thus, in some embodiments, the dummy masking structure 1702 comprises aluminum oxide, and the sixth removal process comprises ammonium hydroxide to selectively remove the dummy masking structure 1702 uncovered by the fourth masking structure 1802 without removing the gate dielectric layer 122. After the sixth removal process, the dummy masking structure 1702 does not directly overlie the first fin structure 104.

Figure 19:
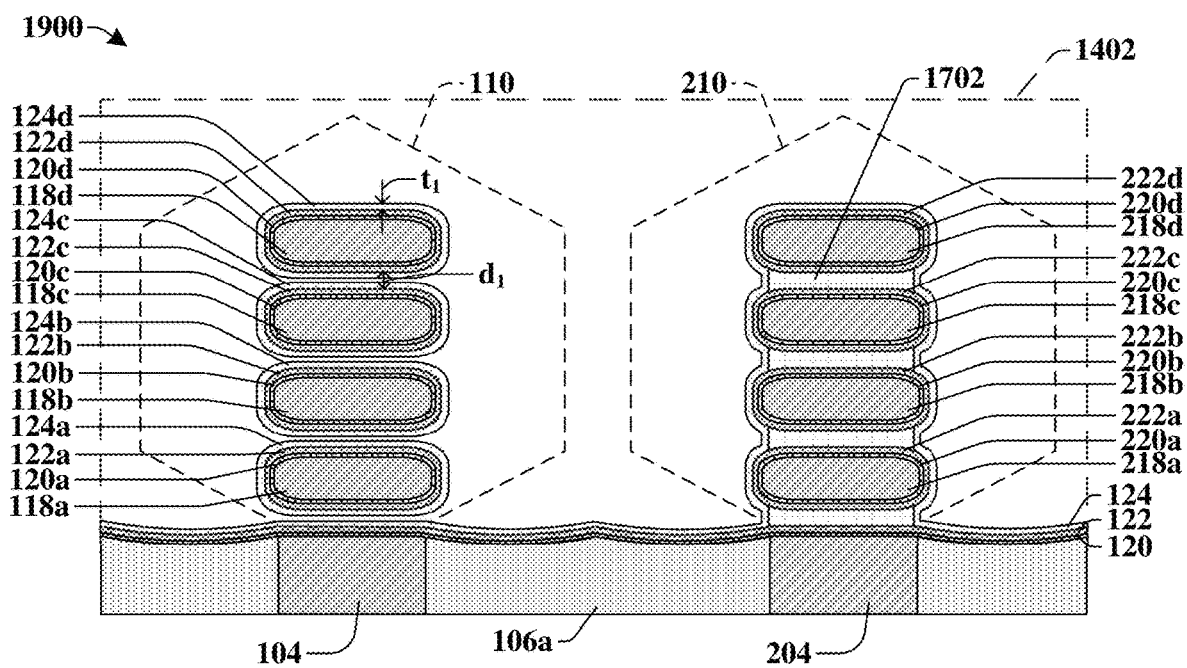

As shown in cross-sectional view 1900 of FIG. 19, in some embodiments, the fourth masking structure 1802 is removed, and a first conductive layer 124 is formed over and completely surrounding the first through fourth nanosheet channel structures 118*a-d*. Because of the dummy masking structure 1702, the first conductive layer 124 does not completely surround the fifth through eighth nanosheet channel structures 218*a-d*, in some embodiments. In some embodiments, the first conductive layer 124 is formed to have a first thickness $t_1$ and comprises a first conductive ring 124*a* around the first nanosheet channel structure 118*a*, a second conductive ring 124*b* around the second nanosheet channel structure 118*b*, a third conductive ring 124*c* around the third nanosheet channel structure 118*c*, and a fourth conductive ring 124*d* around the fourth nanosheet channel structure 118*d*. The first thickness $t_1$ is less than one-half of the first distance $d_1$. Thus, the first conductive layer 124 does not completely fill in the space defined by the first distance $d_1$ between the first fin structure 104 and the first through fourth nanosheet channel structures 118*a-d*.

In some embodiments, the first conductive layer 124 comprises a conductive material, such as titanium nitride. In such embodiments, the first conductive layer 124 may be deposited through a first atomic layer deposition (ALD) process. Because the first ALD process is a self-limiting process, the first thickness $t_1$ of the first conductive layer 124 may be more easily and accurately controlled. For example, in some embodiments, the formation of the first conductive layer 124 by the first ALD process ends when reactive sites or surfaces, such as outer surfaces of the gate dielectric layer 122 are all saturated, or covered, by the first conductive layer 124. In some embodiments, the first thickness $t_1$ is in a range of between, for example, approximately 8 angstroms and approximately 50 angstroms. Further, as illustrated in the plot 100D of FIG. 1D, in some embodiments, the first thickness $t_1$ depends on the first distance $d_1$ and also on a desired first work function of the first gate electrode structure (see, 112 of FIG. 22) to be formed that comprises the first conductive layer 124. In some embodiments, when the first conductive layer 124 comprises titanium nitride, the precursor reactants for the first ALD process comprise titanium tetrachloride and ammonia. It will be appreciated that other materials of the first conductive layer 124 and corresponding precursor reactants to form the first conductive layer 124 are also within the scope of the disclosure.

Figure 20:
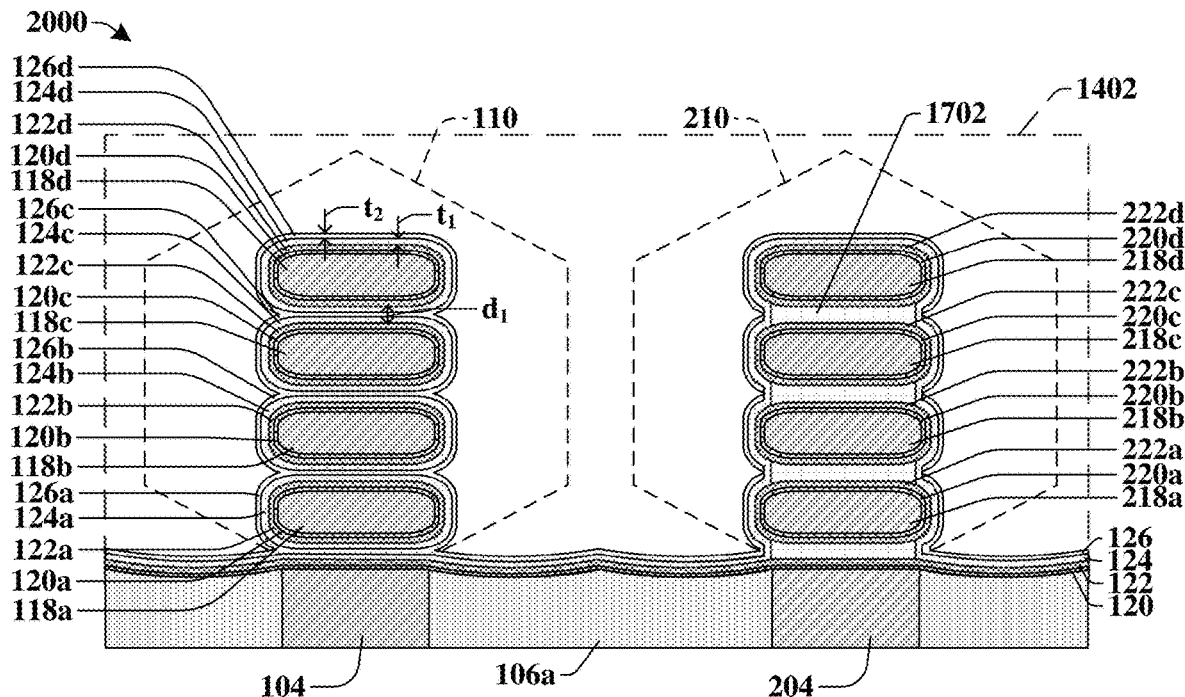

As shown in cross-sectional view 2000 of FIG. 20, in some embodiments, a passivation layer 126 is formed over and around the first conductive layer 124. The passivation layer 126 may be arranged directly between the first fin structure 104 and the first conductive ring 124*a*, directly between the first conductive ring 124*a* and the second conductive ring 124*b*, directly between the second conductive ring 124*b* and the third conductive ring 124*c*, and directly between the third conductive ring 124*c* and the fourth conductive ring 124*d*. The passivation layer 126 comprises a first passivation ring 126*a*, a second passivation ring 126*b*, a third passivation ring 126*c*, and a fourth passivation ring 126*d* that completely cover the first conductive ring 124*a*, the second conductive ring 124*b*, the third conductive ring 124*c*, and the fourth conductive ring 124*d*, respectively. In some embodiments, the passivation layer 126 has a second thickness $t_2$ that may be in a range of between approximately 10 angstroms and approximately 20 angstroms, for example. The second thickness $t_2$ depends at least on the first distance $d_1$ and the first thickness $t_1$. Further, in some embodiments, the passivation layer 126 comprises silicon. In some embodiments wherein the passivation layer 126 comprises silicon and the first conductive layer 124 comprises titanium nitride, the presence of the passivation layer 126 reduces the first work function of the first gate electrode structure (see, 112 of FIG. 22) to be formed that comprises the first conductive layer 124 and the passivation layer 126, as shown in the plot 100D of FIG. 1D.

In some embodiments, the passivation layer 126 is also deposited through an ALD process. By using a second ALD process, the second thickness $t_2$ of the passivation layer 126 may controlled to be less than about 20 angstroms, in some embodiments, and thus, fit between each of the first through fourth conductive rings 124a-d. In some embodiments, the passivation layer 126 comprises silicon, and the precursor reactants for the second ALD process comprises silicon tetrahydride. Further, in some embodiments, the first ALD process to form the first conductive layer 124 is performed in a first reaction chamber, and the second ALD process to form the passivation layer 126 is performed in a second reaction chamber. In such embodiments, the first and second reaction chambers may be part of a same mainframe structure, and thus, a vacuum seal is not broken as the substrate (102 of FIG. 14A) is moved from the first reaction chamber to the second reaction chamber. In such embodiments, the first ALD process may be performed in-situ with the second ALD process because the first and second ALD processes are performed in the same mainframe structure without a break in the vacuum seal. Therefore, between the first ALD process and the second ALD process, the first conductive layer 124 does not oxidize because the vacuum seal is not broken. If the first conductive layer 124 did oxidize between the first ALD process and the second ALD process, there may not be space for the passivation layer 126 to fit between the first through fourth conductive rings 124a-d, in some embodiments. Further, if an oxidation layer were arranged between the passivation layer 126 and the first conductive layer 124, the desired first work function of the first gate electrode structure (see, 112 of FIG. 22) to be formed may not be controlled.

Figure 21:
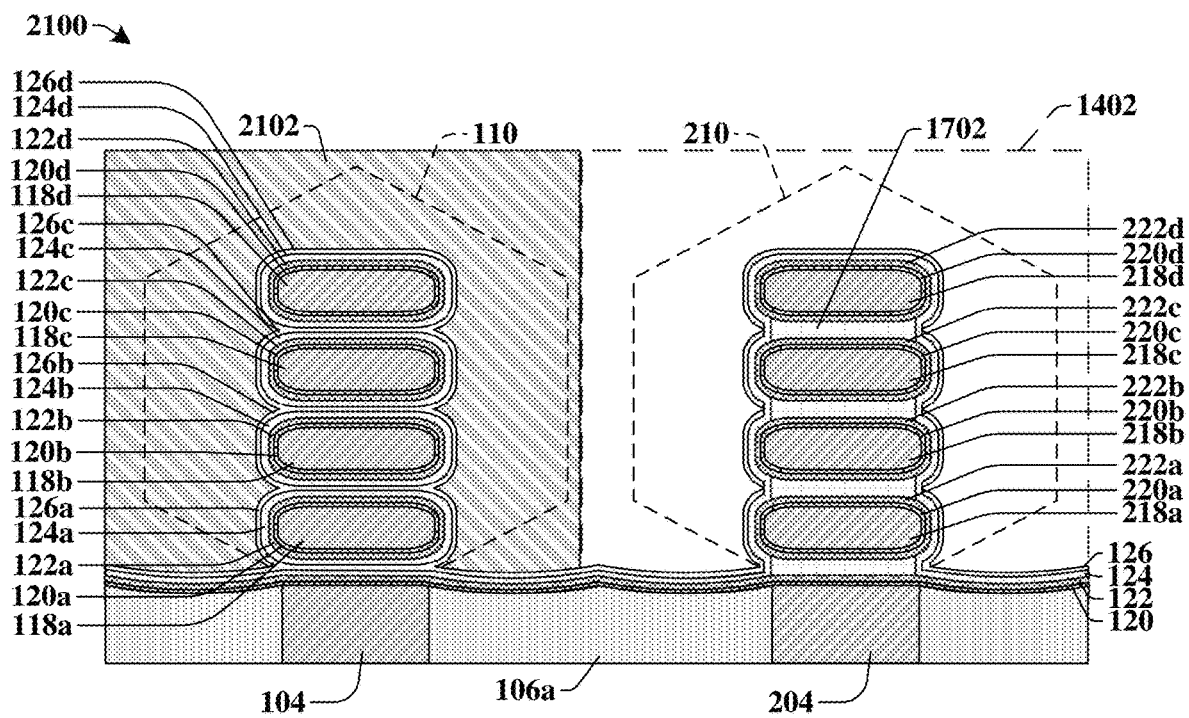

As shown in cross-sectional view 2100 of FIG. 21, in some embodiments, a fifth masking structure 2102 is formed over the first fin structure 104 and the first through fourth nanosheet channel structures 118a-d. The fifth masking structure 2102 does not directly overlie the second fin structure 204 or the fifth through eighth nanosheet channel structures 218a-d. In some embodiments, the fifth masking structure 2102 may be formed using deposition (e.g., spin-coating), photolithography and removal (e.g., etching) processes. For example, in some embodiments, the fifth masking structure 2102 may be or comprise a bottom anti-reflective coating (BARC), an anti-reflective coating (ARC), or some other suitable photoresist material. In some other embodiments, the fifth masking structure 2102 may be or comprise a hard mask material.

Figure 22:
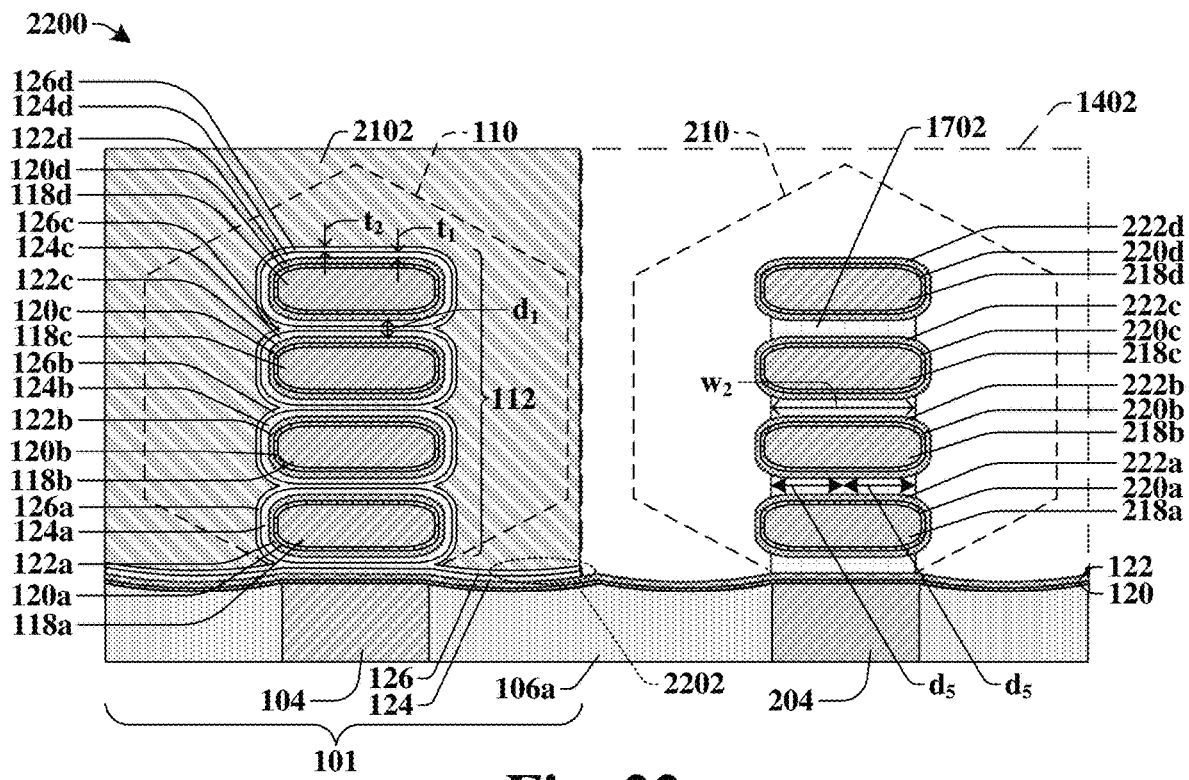

As shown in cross-sectional view 2200 of FIG. 22, in some embodiments, a seventh removal process is performed to remove the passivation layer 126 and the first conductive layer 124 from the fifth through eighth nanosheet channel structures 218a-d and portions of the passivation layer 126 and the first conductive layer 124 that do not directly underlie the fifth masking structure 2102. In some embodiments, the seventh removal process comprises an isotropic etch to remove, in all directions, portions the passivation layer 126 and the first conductive layer 124 that are not directly underlying the fifth masking structure 2102. In some embodiments, for example, the seventh removal process comprises a wet etchant. Further, in some embodiments, the seventh removal process may comprise a first wet etchant to remove portions of the passivation layer 126 and a second wet etchant to remove portions of the first conductive layer 124, whereas in other embodiments, the seventh removal process may comprise one wet etchant that removes both the passivation layer 126 and the first conductive layer 124. After the seventh removal process, a first NSFET 101 is formed comprising a first gate electrode structure 112 that includes the first conductive layer 124 and the passivation layer 126 over the first fin structure 104 and the first through fourth nanosheet channel structures 118a-d. The first gate electrode structure 112 may have a first work function that depends at least on the first thickness $t_1$ and the second thickness $t_2$ of the first conductive layer 124 and the passivation layer 126, respectively.

Further, in some embodiments, the dummy masking structure 1702 reduces a maximum dimension of the first conductive layer 124 and the passivation layer 126 to be removed by the seventh removal process by at least a fifth distance $d_5$. In some embodiments, the fifth distance $d_5$ is equal to about one-half of a second width $w_2$ of the dummy masking structure 1702. In some embodiments, because of the dummy masking structure 1702, the maximum dimension of the first conductive layer 124 for removal by the seventh etching process may be equal to the first thickness $t_1$, and the maximum dimension of the passivation layer 126 by the seventh etching process may be equal to the second thickness $t_2$, for example.

In some embodiments, as a result of the reduction in the maximum dimensions of the first conductive layer 124 and the passivation layer 126 for removal by the seventh removal process, the etching time(s) of the seventh removal process may be reduced. Then, portions 2202 of the first conductive layer 124 and the passivation layer 126 that are arranged directly below the fifth masking structure 2102 and closest to the second fin structure 204 are not exposed to the seventh removal process as long. Therefore, removal of the portions 2202 of the first conductive layer 124 and the passivation layer 126 is prevented or at least mitigated. In other embodiments, without the dummy masking structure 1702, it will be appreciated that over-etching by the seventh removal process could also remove portions of the first conductive ring 124a and/or the first passivation ring 126a, thereby compromising the reliability of the first gate electrode structure 112. Thus, because of the dummy masking structure 1702, the seventh removal process is quicker and exposure of the portions 2202 of the first conductive layer 124 and the passivation layer 126 to the etchant(s) of the seventh removal process is reduced, thereby preventing damage to the first gate electrode structure 112.

Figure 23:
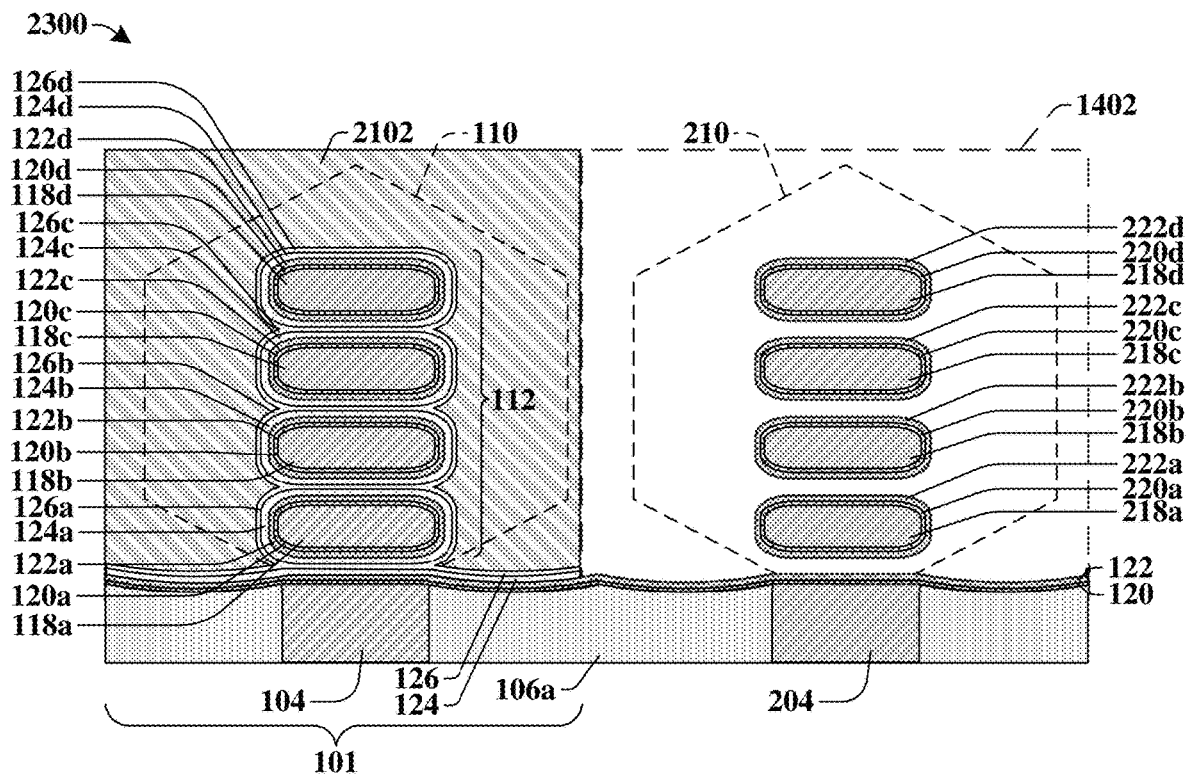

As illustrated in cross-sectional view 2300 of FIG. 23, in some embodiments, an eighth removal process is conducted to completely remove the dummy mask structure (1702 of FIG. 22). In some embodiments, the fifth masking structure 2102 remains over the first NSFET 101 during the eighth removal process. In some embodiments, the eighth removal process comprises an etchant that may remove the dummy mask structure (1702 of FIG. 22) in the lateral direction. In some embodiments, the dummy mask structure (1702 of FIG. 22) may comprise aluminum oxide, and the eighth removal process may use a wet etchant, such as, for example, ammonium hydroxide to completely remove the dummy masking structure (1702 of FIG. 22) while the first conductive layer 124, the passivation layer 126, and the gate dielectric layer 122 remain unchanged. Therefore, the dummy masking structure (1702 of FIG. 22) advantageously reduces over-etching of the first conductive layer 124 and the passivation layer 126 during the seventh removal process of FIG. 22 without damaging other features (e.g., the first conductive layer 124, the passivation layer 126, and the gate dielectric layer 122).

Figure 24:
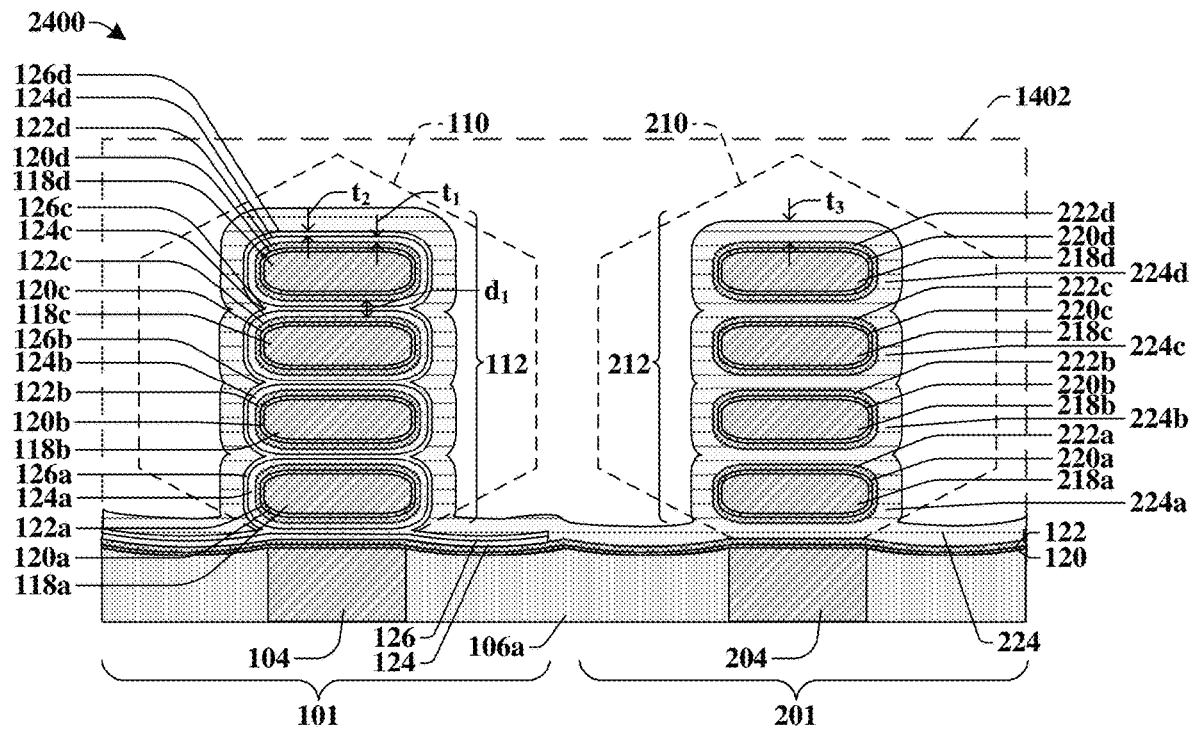

As shown in cross-sectional view 2400 of FIG. 24, in some embodiments, the fifth masking structure (2102 of FIG. 23) is removed, and a second conductive layer 224 is formed over the first fin structure 104, the second fin structure 204, and the first through eighth nanosheet channel structures 118a-d, 218a-d. In some embodiments, the second conductive layer 224 has a third thickness $t_3$ that is at least equal to one-half of the first distance $d_1$ such that the second conductive layer 224 completely and continuously surrounds the fifth through eighth nanosheet channel structures 218a-d. For example, in some embodiments, the second conductive layer 224 comprises a fifth conductive ring 224a, a sixth conductive ring 224b, a seventh conductive ring 224c, and an eighth conductive ring 224d that continuously surrounds and contacts the fifth dielectric ring 222a, the sixth dielectric ring 222b, the seventh dielectric ring 222c, and the eighth dielectric ring 222d, respectively. Further, in some embodiments, the second conductive layer 224 is also arranged over the passivation layer 126. However, in some embodiments, the second conductive layer 224 is not arranged directly between the first fin structure 104 and the first nanosheet channel structure 118a, directly between the first nanosheet channel structure 118a and the second nanosheet channel structure 118b, directly between the second nanosheet channel structure 118b and the third nanosheet channel structure 118c, or directly between the third nanosheet channel structure 118c and the fourth nanosheet channel structure 118d. Further, in some embodiments, the second conductive layer 224 does not affect or does not significantly affect the first work function of the first gate electrode structure 112. Instead, the first work function of the first gate electrode structure 112 is dominated by the first conductive layer 124 and the passivation layer 126 in some embodiments.

In some embodiments, the second conductive layer 224 is deposited by way of a third ALD process. Further, in some embodiments, the second conductive layer 224 comprises a conductive material such as, for example, titanium nitride, tantalum nitride, or the like. In some embodiments, after the formation of the second conductive layer 224, a second gate electrode structure 212 is formed over the second fin structure 204, thereby forming a second NSFET 201 arranged beside the first NSFET 101. In some embodiments, the second gate electrode structure 212 has a second work function that is different than the first work function and that depends at least on the conductive material of the second conductive layer 224. At least because of the dummy masking structure (1702 of FIG. 22), the first NSFET 101 may be formed beside the second NSFET 201, wherein the first gate electrode structure 112 of the first NSFET 101 has a different structure than the second gate electrode structure 212 of the second NSFET 201, in some embodiments.

Further, it will be appreciated that in some instances, the first NSFET 101 and the second NSFET 201 may be also known as, for example, a gate-all-around FET, a gate surrounding transistor, a multi-bridge channel (MBC) transistor, a nanowire FET, or the like.

Figure 25:
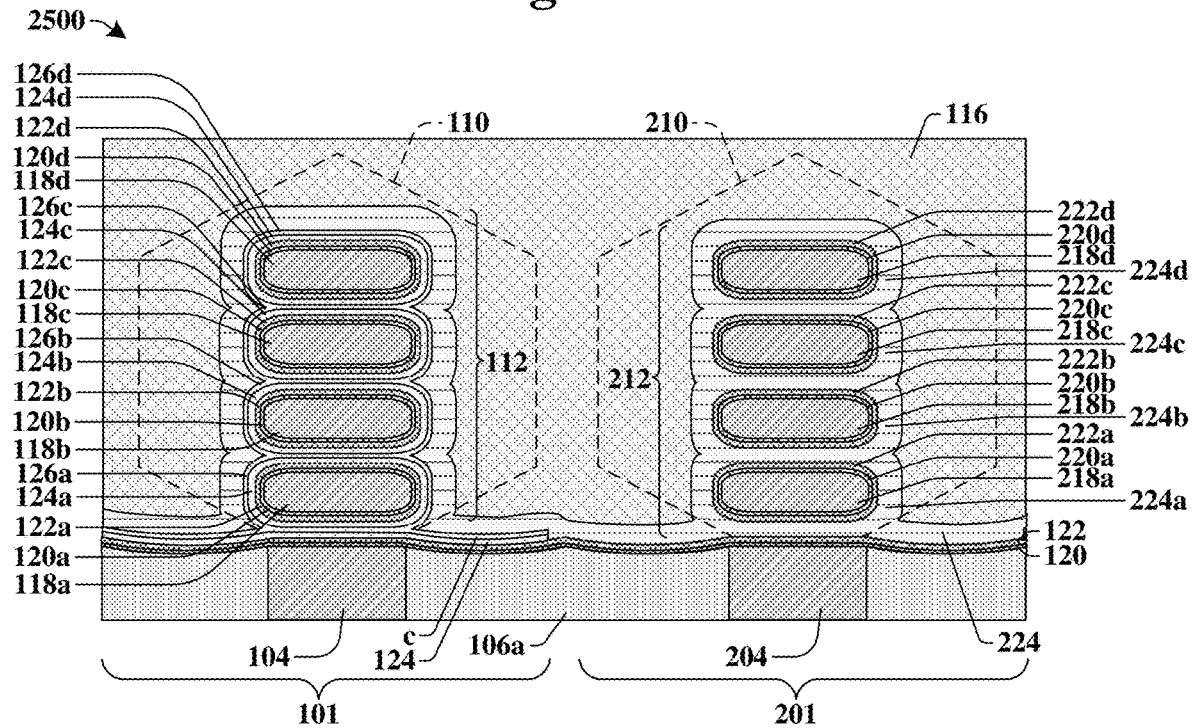

As shown in cross-sectional view 2500 of FIG. 25, in some embodiments, a glue layer 116 is formed over the first and second NSFETs 101, 201. In some embodiments, the glue layer 116 comprises a conductive material such as, for example, titanium nitride, tantalum nitride, tungsten carbon nitride, or some other suitable material. In some embodiments, the glue layer 116 is formed by way of a deposition process (e.g., CVD, PE-CVD, PVD, ALD, sputtering, etc.).

Further, in some embodiments, the glue layer 116 does not affect or does not significantly affect the first work function of the first gate electrode structure 112 or the second work function of the second gate electrode structure 212. Instead, the first work function of the first gate electrode structure 112 is dominated by the first conductive layer 124 and the passivation layer 126, and the second work function of the second gate electrode structure 212 is dominated by the second conductive layer 224.

Figure 26:
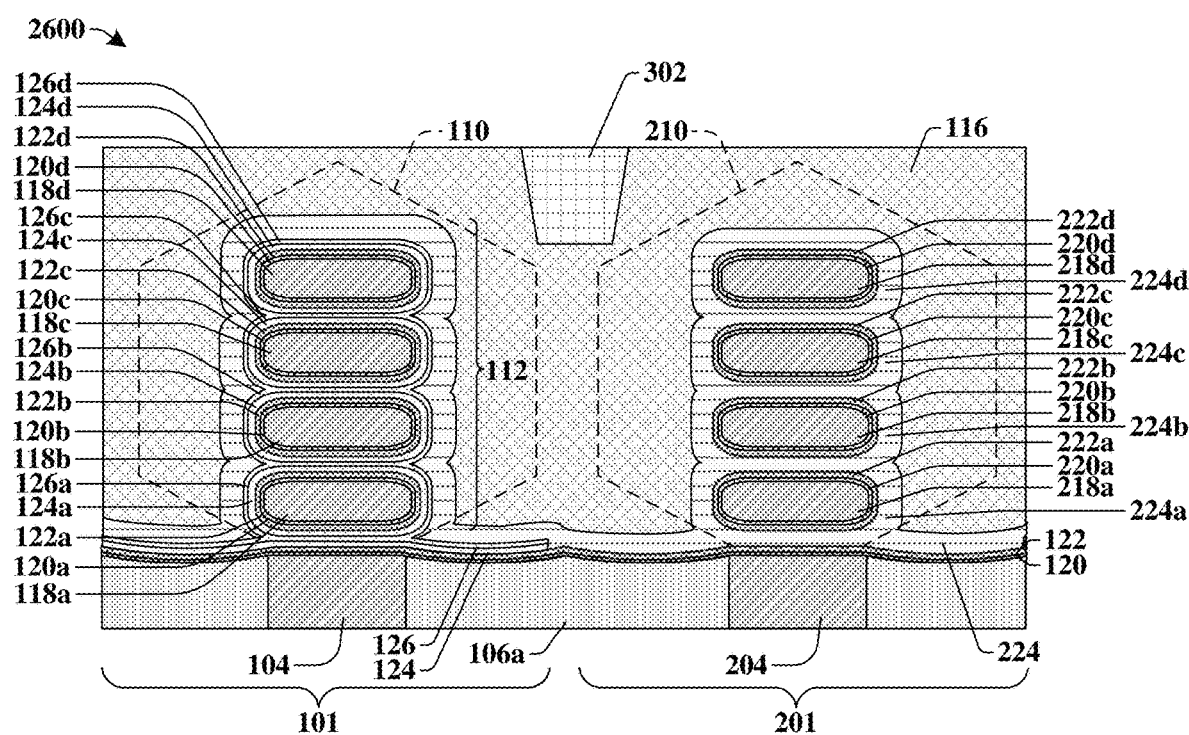

As shown in cross-sectional view 2600 of FIG. 26, in some embodiments, a contact via 302 is formed within the glue layer 116. In some embodiments, the contact via 302 may comprise, for example, tungsten, aluminum, copper, or some other suitable conductive material. In some embodiments, the contact via 302 may be formed through various steps comprising deposition processes (e.g., physical vapor deposition (PVD), chemical vapor deposition (CVD), PE-CVD, atomic layer deposition (ALD), sputtering, etc.), removal processes (e.g., wet etching, dry etching, chemical mechanical planarization (CMP), etc.), and/or patterning processes (e.g., photolithography/etching). During operation, in some embodiments, the contact via 302 may be coupled to a gate electrode source. Because the first work function of the first gate electrode structure 112 is different than the second gate electrode structure 212, the first NSFET 101 may have a first threshold voltage that is different than the second NSFET 201. Therefore, in some embodiments, the gate electrode source may selectively turn "ON" the first NSFET 101 or the second NSFET 201.

Figure 27:
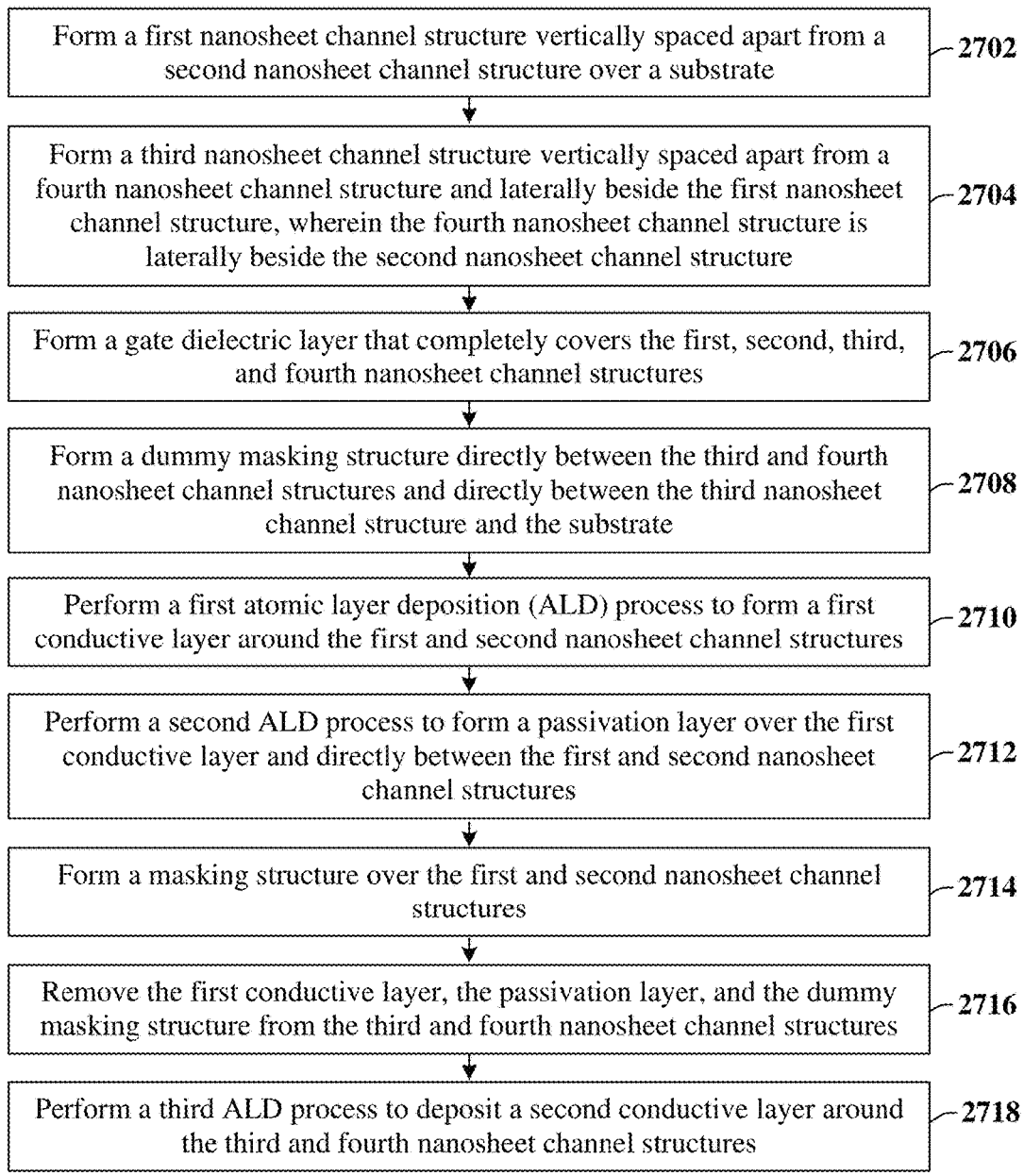
FIG. 27 illustrates a flow diagram of some embodiments of a method corresponding to FIGS. 4-26.

FIG. 27 illustrates a flow diagram of some embodiments of a method 2700 of forming a first NSFET beside a second NSFET corresponding to FIGS. 4-26.

While method 2700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2702, a first nanosheet channel structure is formed that is vertically spaced apart from a second nanosheet channel structure and over a substrate.

At act 2704, a third nanosheet channel structure is formed that is vertically spaced apart from a fourth nanosheet channel structure and laterally beside the first nanosheet channel structure, wherein the fourth nanosheet channel structure is laterally beside the second nanosheet channel structure. FIGS. 4-1400B illustrate various views 400-1400B of some embodiments corresponding to acts 2702 and 2704.

At act 2706, a gate dielectric layer is formed to completely cover the first, second, third, and fourth nanosheet channel structures. FIG. 15 illustrates cross-sectional view 1500 of some embodiments corresponding to act 2706.

At act 2708, a dummy masking structure is formed directly between the third and fourth nanosheet channel structures and directly between the third nanosheet channel structure and the substrate. FIGS. 16-18 illustrate cross-sectional views 1600-1800 of some embodiments corresponding to act 2708.

At act 2710, a first ALD process is performed to form a first conductive layer around the first and second nanosheet channel structures. FIG. 19 illustrates cross-sectional view 1900 of some embodiments corresponding to act 2710.

At act 2712, a second ALD process is performed to form a passivation layer over the first conductive layer and directly between the first and second nanosheet channel structures. FIG. 20 illustrates cross-sectional view 2000 of some embodiments corresponding to act 2712.

At act 2714, a masking structure is formed over the first and second nanosheet channel structures. FIG. 21 illustrates cross-sectional view 2100 of some embodiments corresponding to act 2714.

At act 2716, the first conductive layer, the passivation layer, and the dummy masking structure are removed from the third and fourth nanosheet channel structures. FIGS. 22 and 23 respectively illustrate cross-sectional views 2200 and 2300 of some embodiments corresponding to act 2716.

At act 2718, a third ALD process is performed to deposit a second conductive layer around the third and fourth nanosheet channel structures. FIG. 24 illustrates cross-sectional view 2400 of some embodiments corresponding to act 2718.

Therefore, the present disclosure relates to a method of forming a first NSFET having a first gate electrode structure laterally beside a second NSFET having a second gate electrode structure by forming a dummy masking structure and conducting ALD processes to increase device density while still maintaining reliability of the first and second NSFETs.

Accordingly, in some embodiments, the present disclosure relates to an integrated chip comprising: a first nanosheet field effect transistor (NSFET) comprising: a first nanosheet channel structure arranged over a substrate; a second nanosheet channel structure arranged directly over the first nanosheet channel structure and extending in parallel from a first source/drain region to a second source/drain region; and a first gate electrode structure comprising: a first conductive ring comprising a first material and completely surrounding outer sidewalls of the first nanosheet channel structure, a second conductive ring comprising the first material and completely surrounding outer sidewalls of the second nanosheet channel structure, and a passivation layer completely surrounding the first conductive ring and the second conductive ring, arranged directly between the first nanosheet channel structure and the second nanosheet channel structure, and comprising a second material different than the first material.

In other embodiments, the present disclosure relates to an integrated chip comprising: a first nanosheet field effect transistor (NSFET) comprising: a first source/drain region and a second source/drain region having a first doping type and arranged over a substrate; a first nanosheet channel structure and a second nanosheet channel structure arranged over a substrate and extending in parallel between the first and second source/drain regions, wherein the second nanosheet channel structure is arranged directly over the first nanosheet channel structure; a first gate electrode structure comprising: a first conductive ring completely surrounding the first nanosheet channel structure, and a second conductive ring completely surrounding the second nanosheet channel structure; and a second NSFET arranged laterally beside the first NSFET and comprising: a third source/drain region and a fourth source/drain region having a second doping type different than the first doping type and arranged over the substrate; a third nanosheet channel structure and a fourth nanosheet channel structure arranged over the substrate and extending in parallel between the third and fourth source/drain regions, wherein the fourth nanosheet channel structure is arranged directly over the third nanosheet channel structure; and a second gate electrode structure comprising: a third conductive ring completely surrounding the third nanosheet channel structure, a fourth conductive ring completely surrounding the fourth nanosheet channel structure, and a passivation layer surrounding the third and fourth conductive rings and directly separating the third conductive ring from the fourth conductive ring.

In yet other embodiments, the present disclosure relates to a method of forming an integrated chip comprising: forming a first nanosheet channel structure and a second nanosheet channel structure over a substrate and extending in parallel between a first source/drain region and a second source/drain region, wherein the second nanosheet channel structure is arranged directly over the first nanosheet channel structure; forming a first dielectric ring and a second dielectric ring covering outer surfaces of the first nanosheet channel structure and the second nanosheet channel structure, respectively; performing a first atomic layer deposition (ALD) process to form a first conductive layer over the substrate and comprising a first conductive ring over the first dielectric ring and a second conductive ring over the second dielectric ring; and performing a second ALD process to form a passivation layer over the first and second conductive rings, wherein the passivation layer separates the first and second conductive rings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip comprising:
    forming a first nanosheet channel structure and a second nanosheet channel structure over a substrate, the first nanosheet channel structure and the second nanosheet channel structure extending in parallel between a first source/drain region and a second source/drain region, wherein the second nanosheet channel structure is arranged directly over the first nanosheet channel structure;
    forming a first gate dielectric and a second gate dielectric concentrically surrounding the first nanosheet channel structure and the second nanosheet channel structure, respectively;
    performing a first atomic layer deposition (ALD) process to form a first conductive layer over the substrate, the first conductive layer comprising a first conductive gate electrode concentrically surrounding the first gate dielectric and a second conductive gate electrode concentrically surrounding the second gate dielectric; and
    performing a second ALD process to form a passivation layer concentrically and conformally surrounding the first and second conductive gate electrodes, wherein the passivation layer separates outermost surfaces of the first and second conductive gate electrodes from one another.

2. The method of claim 1, wherein the first ALD process comprises titanium tetrachloride and ammonia precursors.

3. The method of claim 1, wherein the second ALD process is performed in-situ with the first ALD process.

4. The method of claim 1, further comprising:
forming a third nanosheet channel structure and a fourth nanosheet channel structure over the substrate, arranged laterally beside the first nanosheet channel structure and the second nanosheet channel structure, and extending in parallel between a third source/drain region and a fourth source/drain region, wherein the fourth nanosheet channel structure is arranged directly over the third nanosheet channel structure;
forming a third dielectric and a fourth dielectric covering outer surfaces of the third nanosheet channel structure and the fourth nanosheet channel structure, respectively;
forming a dummy masking layer over and between the first, second, third, and fourth nanosheet channel structures; and
removing portions of the dummy masking layer from the first, second, third, and fourth nanosheet channel structures such that a dummy masking structure is arranged directly between the third nanosheet channel structure and the fourth nanosheet channel structure and directly between the third nanosheet channel structure and the substrate,
wherein performing the first ALD process and performing the second ALD process are conducted after forming the dummy masking structure.

5. The method of claim 4, further comprising:
covering the first and second nanosheet channel structures with a masking structure;
removing the passivation layer and the first conductive layer from the third and fourth nanosheet channel structures; and
removing the dummy masking structure from between the third nanosheet channel structure and the fourth nanosheet channel structure and directly between the third nanosheet channel structure and the substrate.

6. The method of claim 5, wherein the dummy masking structure comprises aluminum oxide, and wherein the removing of the dummy masking structure is performed using a wet etchant comprising ammonium hydroxide.

7. The method of claim 1, wherein the first conductive layer lines the first source/drain region and the second source/drain region and extends between the first source/drain region and the second source/drain region in a first direction, the first conductive layer forming a "U" shape when viewed along a cross-sectional plane that extends in the first direction.

8. A method of forming an integrated chip comprising:
forming a first nanosheet channel structure and a second nanosheet channel structure over a substrate, the first nanosheet channel structure and the second nanosheet channel structure extending in a first direction and on opposite sides of a plane extending in the first direction, the first nanosheet channel structure and the second nanosheet channel structure extending between a first source/drain region and a second source/drain region, wherein the second nanosheet channel structure is arranged directly over the first nanosheet channel structure;
forming a first interfacial layer comprising a first interfacial structure covering outer surfaces of the first nanosheet channel structure and a second interfacial structure over the second nanosheet channel structure;
forming a first gate dielectric structure and a second gate dielectric structure concentrically surrounding the first interfacial structure and the second interfacial structure, respectively;
forming a first conductive layer over the substrate, the first conductive layer comprising a first conductive gate electrode structure concentrically surrounding the first gate dielectric structure and a second conductive gate electrode structure concentrically surrounding the second gate dielectric structure; and
forming a passivation layer concentrically surrounding the first and second gate electrode conductive structures, wherein the passivation layer is traversed by the plane and separates the first and second conductive gate electrode structures, the passivation layer having an indented sidewall where the passivation layer is traversed by the plane.

9. The method of claim 8, wherein the second nanosheet channel structure extends parallel to the first nanosheet channel structure.

10. The method of claim 8, wherein the first interfacial layer extends up inner sidewalls of the first source/drain region and the second source/drain region, and extends between the first source/drain region and the second source/drain region, forming a "U" shape.

11. The method of claim 8, wherein the first interfacial layer spaces the first conductive layer from the first source/drain region.

12. The method of claim 11, wherein the first conductive gate electrode structure completely and concentrically surrounds the first interfacial structure.

13. The method of claim 8, further comprising:
forming a first gate spacer layer before the forming of the first source/drain region, the first gate spacer layer lining the first source/drain region; and
forming a second gate spacer layer, the second gate spacer layer lining the second source/drain region;
wherein the first gate spacer layer and the second gate spacer layer space the first interfacial layer from the first source/drain region and the second source/drain region, respectively.

14. The method of claim 8, further comprising forming a second conductive layer over the first nanosheet channel structure and the second nanosheet channel structure, wherein the first conductive layer comprises a conformal portion that extends beneath the first conductive gate electrode structure, and the second conductive layer extends directly between the first conductive gate electrode structure and the conformal portion of the first conductive layer.

15. A method of forming an integrated chip comprising:
forming a first fin structure over a substrate;
forming a dummy gate over a central portion of the first fin structure while leaving outer portions of the first fin structure exposed on opposite sides of the dummy gate;
forming a gate spacer layer over the dummy gate and over the outer portions of the first fin structure;
removing the outer portions of the first fin structure while leaving the central portion of the first fin structure in place;
forming a first source/drain region and a second source/drain region on the opposite sides of the dummy gate, the gate spacer layer separating the dummy gate from the first source/drain region and the second source/drain region;
removing the dummy gate to form a recess;
forming a first replacement gate electrode structure extending between the first source/drain region and the second source/drain region in the recess, the gate spacer layer spacing the first replacement gate electrode structure from the first source/drain region and the second source/drain region; and forming a passivation layer concentrically and conformally surrounding the first replacement gate electrode structure.

16. The method of claim 15, further comprising removing portions of the gate spacer layer, separating the gate spacer layer into a first gate spacer layer and a second gate spacer layer.

17. The method of claim 15, wherein the first replacement gate electrode structure comprises a first interfacial layer, the first interfacial layer extending up inner sidewalls of the gate spacer layer and beneath semiconductor layers of the first fin structure.

18. The method of claim 15, further comprising forming semiconductor layers of the first fin structure into a first nanosheet channel structure and a second nanosheet channel structure.

19. The method of claim 18, wherein the first replacement gate electrode structure comprises:

a first dielectric layer comprising a first dielectric structure surrounding the first nanosheet channel structure, a second dielectric structure surrounding the second nanosheet channel structure, and a conformal dielectric layer lining inner sidewalls of the gate spacer layer and extending beneath the first dielectric structure; and a first conductive layer, comprising a first conductive structure surrounding the first dielectric structure, a second conductive structure surrounding the second dielectric structure, and a conformal conductive layer lining inner sidewalls of the conformal dielectric layer and extending beneath the first conductive structure.

20. The method of claim 15, wherein the first source/drain region and the second source/drain region comprise doped silicon and are formed using epitaxial growth.

* * * * *